(12) United States Patent
Tokunaga et al.

(10) Patent No.: US 8,513,878 B2
(45) Date of Patent: Aug. 20, 2013

(54) SPONTANEOUS EMISSION DISPLAY, SPONTANEOUS EMISSION DISPLAY MANUFACTURING METHOD, TRANSPARENT CONDUCTIVE FILM, ELECTROLUMINESCENCE DEVICE, SOLAR CELL TRANSPARENT ELECTRODE, AND ELECTRONIC PAPER TRANSPARENT ELECTRODE

(75) Inventors: Tsukasa Tokunaga, Kanagawa (JP); Makoto Kusuoka, Kanagawa (JP); Tadashi Kuriki, Kanagawa (JP); Akira Ichiki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 795 days.

(21) Appl. No.: 12/307,482

(22) PCT Filed: Sep. 28, 2007

(86) PCT No.: PCT/JP2007/068968
§ 371 (c)(1),
(2), (4) Date: Apr. 30, 2009

(87) PCT Pub. No.: WO2008/038764
PCT Pub. Date: Apr. 3, 2008

(65) Prior Publication Data
US 2009/0295285 A1      Dec. 3, 2009

(30) Foreign Application Priority Data

Sep. 28, 2006 (JP) ................. 2006-265001
Mar. 28, 2007 (JP) ................. 2007-084868
May 18, 2007 (JP) ................. 2007-133286

(51) Int. Cl.
*H01J 1/62* (2006.01)

(52) U.S. Cl.
USPC .......................................... 313/505; 174/256

(58) Field of Classification Search
USPC .......................................................... 313/505
See application file for complete search history.

(56) References Cited

U.S. PATENT DOCUMENTS

| 7,404,915 B2 | 7/2008 | Goto et al. |
| 2005/0042556 A1 | 2/2005 | Louwet et al. |

FOREIGN PATENT DOCUMENTS

| EP | 2 096 648 | 9/2009 |
| JP | 08-180974 | 7/1996 |

(Continued)

OTHER PUBLICATIONS

JP Office Action dated Feb. 28, 2012, Application No. 2007-255763.

(Continued)

*Primary Examiner* — Joseph L Williams
*Assistant Examiner* — Brenitra M Lee
(74) *Attorney, Agent, or Firm* — Young & Thompson

(57) ABSTRACT

A spontaneous emission display includes a support, a first electrode section provided on the support and having a fine wire structure portion made of a conductive metal and a translucent conductive film, and a display section formed on the first electrode section and having a light-emitting layer. The volume resistance of the fine wire structure portion of the first electrode is $10^{-4}$ Ω·cm or less and/or the surface resistance thereof is 100 Ω/sq or less. The volume resistance of the conductive film is 0.05 Ω·cm or more and/or the surface resistance thereof is 100 Ω/sq or more. When the surface resistance of the first electrode section before a bending test is denoted by R1 and that after the bending test is denoted by R2, R2/R1<18 is satisfied.

12 Claims, 15 Drawing Sheets

(56) References Cited

FOREIGN PATENT DOCUMENTS

| | | |
|---|---|---|
| JP | 8-201791 | 8/1996 |
| JP | 09-147639 | 6/1997 |
| JP | 10-162961 | 6/1998 |
| JP | 11-224782 | 8/1999 |
| JP | 2000-269682 | 9/2000 |
| JP | 2004-253329 | 9/2004 |
| JP | 2005-302508 | 10/2005 |
| JP | 2006-024485 | 1/2006 |
| JP | 2006-501604 | 1/2006 |
| JP | 2006-202738 | 8/2006 |
| JP | 2006-228478 | 8/2006 |
| JP | 8-249929 | 9/2006 |
| JP | 2007-86771 | 4/2007 |
| WO | 2004/019345 | 3/2004 |
| WO | 2007/069495 | 6/2007 |
| WO | WO2007148773 | * 12/2007 |

OTHER PUBLICATIONS

JP Office Action dated Oct. 16, 2012, with English translation; Application No. 2007-255763.

European Search Report—EP 07 82 8709—May 22, 2012.

* cited by examiner

LIGHT EMISSION ONLY IN
VICINITY OF THIN-WIRE
STRUCTURE PORTION

LIGHT EMISSION OVER
ENTIRE SURFACE

SPONTANEOUS EMISSION DISPLAY, SPONTANEOUS EMISSION DISPLAY MANUFACTURING METHOD, TRANSPARENT CONDUCTIVE FILM, ELECTROLUMINESCENCE DEVICE, SOLAR CELL TRANSPARENT ELECTRODE, AND ELECTRONIC PAPER TRANSPARENT ELECTRODE

TECHNICAL FIELD

The present invention relates to a self-luminous display device having an electrode region with high light transmittance, low surface resistivity, and excellent flexibility, a method for producing the display device, a transparent conductive film with high light transmittance, low surface resistivity, and excellent flexibility, and an electroluminescence device, a solar cell transparent electrode, and an electronic paper transparent electrode containing the transparent conductive film. The self-luminous display device may be a light-emitting device for lighting purpose.

BACKGROUND ART

In recent years, in liquid crystal displays, organic and inorganic electroluminescence devices, electronic papers, etc., a film or a glass substrate having a transparent conductive layer has been used as an electrode on the light-emitting side (see, for example, Patent Documents 1 to 4).

The transparent conductive layer is generally composed of an indium tin oxide, a zinc oxide, a tin oxide, etc., and has to be thick and uniform to achieve low resistance. Thus, the transparent conductive layer is disadvantageous in low light transmittance, high cost, and that a high temperature treatment is needed in the formation process. Particularly in the case of forming the layer on the film, the resistance can be lowered only to a limited extent.

In view of reducing the problem, proposed are a method containing adding a conductive component such as a metal wire to a transparent electrode layer (Patent Document 2), a method containing forming a busline of a conductive metal on a transparent electrode layer (a transparent positive electrode substrate) (Patent Documents 1 and 3), and a method containing forming a network-patterned metal wire structure on a transparent electrode layer (an upper electrode) (Patent Document 5).

The methods described in Patent Documents 1 and 2, etc., which include vapor-depositing or sputtering a transparent electrode layer of a conductive metal, such as an ITO (Indium Tin Oxide) layer, to increase conductivity, are poor in productivity, and need improvement on this point. Furthermore, in the method using the busline, the number of processes is increased, thereby resulting in high cost.

In Patent Document 5, an ITO layer is vapor-deposited to increase conductivity. However, there are fears of depletion of the ITO, and thus an alternative material is demanded. In addition, great loss is disadvantageously caused in the vapor deposition process.

In a method disclosed in Patent Document 6, a substantially transparent conductive layer, which contains an intrinsically conductive polymer and a conductive metal nonuniformly distributed therein, is formed on a support. The conductive layer per se acts as a conductor, and the nonuniformly distributed conductive metal is generated by a photographic processing. However, the method is unsatisfactory for the purpose of mass-producing a transparent conductive film having high light transmittance and low surface resistance at low cost.

Recently flexible displays using organic EL and electronic paper technologies, etc. have been actively studied, and a flexible transparent conductive film is needed in the flexible display. When the above transparent conductive layer is bent, the layer is finely cracked, resulting in deterioration in conductivity. In recent years, transparent conductive resins (such as PEDOT/PSS) and nanotechnology materials (such as carbon nanotubes, metal nanowires, and metal nanorods) have been actively studied as flexible conductive material. However, the materials cannot alone achieve a low resistance as the ITO layer.

Patent Document 1: Japanese Laid-Open Patent Publication No. 08-180974
Patent Document 2: Japanese Laid-Open Patent Publication No. 09-147639
Patent Document 3: Japanese Laid-Open Patent Publication No. 10-162961
Patent Document 4: Japanese Laid-Open Patent Publication No. 11-224782
Patent Document 5: Japanese Laid-Open Patent Publication No. 2005-302508
Patent Document 6: Japanese Laid-Open Patent Publication No. 2006-501604 (PCT)

DISCLOSURE OF THE INVENTION

Under such circumstances, the present invention has been accomplished to solve the above problems and achieve the following objects.

Thus, an object of the present invention is to provide a self-luminous display device having an electrode region with high light transmittance, low surface resistivity, and excellent flexibility, and a producing method thereof.

A further object of the present invention is to provide a transparent conductive film with high light transmittance, low surface resistivity, and excellent flexibility, and an electroluminescence device, a solar cell transparent electrode, and an electronic paper transparent electrode containing the transparent conductive film.

The objects of the present invention have been achieved by the following particular matters and preferred embodiments.

[1] A self-luminous display device according to a first aspect of the present invention, comprising a support, an electrode region, and a display region, wherein the electrode region is formed on the support and has a thin-wire structure portion containing a conductive metal and a light-transmitting conductive layer, the display region is disposed on the electrode region and has a light-emitting layer, in the electrode region, the thin-wire structure portion has a volume resistance of $10^{-4}$ $\Omega \cdot$cm or less and/or a surface resistance of 100 $\Omega$/sq or less, and the conductive layer has a volume resistance of 0.05 $\Omega \cdot$cm or more and/or a surface resistance of 100 $\Omega$/sq or more, and when the electrode region has a surface resistance R1 before a bending test and has a surface resistance R2 after the bending test, the electrode region satisfies R2/R1<18.

In the bending test, a roller having a diameter of 4 mm is rotatably attached to a base, and the electrode region is hanged on the roller and is bent 100 times by repeating a process of rotating the roller while pulling one end of the electrode region at a tension of 28.6 (kg) per width of 1 m and a process of rotating the roller while pulling the other end of the electrode region at a tension of 28.6 (kg) per width of 1 m.

[2] A self-luminous display device according to [1], wherein the conductive layer in the electrode region contains a conductive material.

[3] A self-luminous display device according to [2], wherein the conductive material contains a conductive transparent organic polymer or a conductive fine particle.

[4] A self-luminous display device according to [3], wherein the conductive fine particle contains a conductive metal oxide, a conductive fine metal particle, or a carbon nanotube.

[5] A self-luminous display device according to [1], wherein the thin-wire structure portion in the electrode region has a thickness (height) of 10 μm or less.

[6] A self-luminous display device according to [1], wherein the thin-wire structure portion in the electrode region has a thickness (height) of 5 μm or less.

[7] A self-luminous display device according to [1], wherein the thickness (height) of the thin-wire structure portion is substantially the same as that of the conductive layer.

[8] A self-luminous display device according to [1], wherein the conductive layer is formed on an upper surface or a lower surface of the thin-wire structure portion.

[9] A self-luminous display device according to [1], wherein the electrode region has a light transmittance of 70% or more for a 550-nm light.

[10] A self-luminous display device according to [1], wherein the thin-wire structure portion in the electrode region contains a conductive metallic silver generated by exposing and developing a photosensitive layer containing at least a photosensitive silver salt layer on the support.

[11] A self-luminous display device according to [10], wherein the thin-wire structure portion in the electrode region is formed by exposing and developing a photosensitive material comprising the support and thereon the photosensitive silver salt layer to form a conductive metallic silver portion and a light-transmitting portion.

[12] A self-luminous display device according to [11], wherein the electrode region has the conductive layer, the thin-wire structure portion, and the light-transmitting portion, and the thin-wire structure portion and the light-transmitting portion are formed by exposing and developing a photosensitive material comprising the support and thereon a photograph-constituting layer containing at least a photosensitive silver halide layer and a conductive material-containing layer.

[13] A self-luminous display device according to [10], wherein the thin-wire structure portion in the electrode region contains silver at an Ag/binder volume ratio of 1/4 or more.

[14] A self-luminous display device according to [10], wherein the thin-wire structure portion in the electrode region is formed by exposing, developing, and fixing a photosensitive material comprising the support and thereon the photosensitive silver salt layer, and by subjecting the material to a compression treatment at least once.

[15] A self-luminous display device according to [14], wherein the compression treatment is carried out after the photosensitive layer is exposed, developed, water-washed, dried, fixed, water-washed, and dried.

[16] A self-luminous display device according to [14], wherein the compression treatment is carried out using a calender roll unit.

[17] A self-luminous display device according to [14], wherein the compression treatment is carried out at a line pressure of 1980 N/cm (200 kgf/cm) or more.

[18] A self-luminous display device according to [14], wherein the compression treatment is carried out at a line pressure of 2960 N/cm (300 kgf/cm) or more.

[19] A self-luminous display device according to [14], wherein the compression treatment is carried out at a line pressure of 6860 N/cm (700 kgf/cm) or less.

[20] A self-luminous display device according to [14], wherein the thin-wire structure portion in the electrode region is formed by, after the above developing, carrying out at least one of physical development, electrolytic plating, and electroless plating before drying.

[21] A self-luminous display device according to [1], wherein the electrode region is obtained by forming the thin-wire structure portion and by bonding the thin-wire structure portion with the conductive layer.

[22] A self-luminous display device according to [1], wherein the support has a thickness of 8 to 200 μm.

[23] A self-luminous display device according to [1], wherein the support is a film of a resin selected from polyesters such as polyethylene terephthalates (PET) and polyethylene naphthalates; polyolefins such as polyethylenes (PE), polypropylenes (PP), polystyrenes, and EVA; vinyl resins such as polyvinyl chlorides and polyvinylidene chlorides; polyether ether ketones (PEEK); polysulfones (PSF); polyether sulfones (PES); polycarbonates (PC); polyamides; polyimides; acrylic resins; triacetyl celluloses (TAC); and the like.

[24] A method according to a second aspect of the present invention for producing a self-luminous display device, comprising the steps of:

exposing and developing a photosensitive material comprising a support and thereon a photograph-constituting layer containing at least a photosensitive silver halide layer to form a thin-wire structure portion containing a conductive metal on the support; and combining the thin-wire structure portion with a transparent conductive layer.

[25] A method according to [24], further comprising subjecting the thin-wire structure portion to a compression treatment.

[26] A method according to [25], further comprising dipping the photosensitive material in an aqueous solution of a reducing agent before the compression treatment.

[27] A method according to [25], further comprising subjecting a surface of a metallic silver portion to a blackening treatment using a blackening liquid after the compression treatment.

[28] A method according to [27], wherein the blackening liquid contains nickel, zinc, or tin.

[29] A method according to a third aspect of the present invention for producing a self-luminous display device, comprising the steps of:

forming a photograph-constituting layer having at least a photosensitive silver halide layer and a conductive material-containing layer on a support to prepare a photosensitive material; and exposing and developing the photosensitive material to form an electrode region having a thin-wire structure portion containing a conductive metal and a light-transmitting conductive layer on the support.

[30] A transparent conductive film according to a fourth aspect of the present invention, comprising a support, and a thin-wire structure portion containing a conductive metal and a light-transmitting conductive layer which are formed on the support, wherein the thin-wire structure portion has a volume resistance of $10^{-4}$ Ω·cm or less and/or a surface resistance of 100 Ω/sq or less, and the conductive layer has a volume resistance of 0.05 Ω·cm or more and/or a surface resistance of 100 Ω/sq or more, and when the transparent conductive film has a surface resistance R1 before a bending test and has a surface resistance R2 after the bending test, the transparent conductive film satisfies R2/R1<18.

In the bending test, a roller having a diameter of 4 mm is rotatably attached to a base, and the transparent conductive film is hanged on the roller and is bent 100 times by repeating a process of rotating the roller while pulling one end of the transparent conductive film at a tension of 28.6 (kg) per width of 1 m and a process of rotating the roller while pulling the other end of the transparent conductive film at a tension of 28.6 (kg) per width of 1 m.

[31] A transparent conductive film according to [30], wherein the thin-wire structure portion contains a silver at a density of 8.0 to 10.5 g/cm$^3$.

[32] A transparent conductive film according to [30], wherein the thin-wire structure portion has a thickness of 0.5 to 10 μm.

[33] A transparent conductive film according to [30], wherein the thin-wire structure portion has a wiring pattern with a line width of 0.1 to 25 μm.

[34] A method according to a fifth aspect of the present invention for producing a transparent conductive film, comprising the steps of:

exposing and developing a photosensitive material comprising a support and thereon a photograph-constituting layer containing at least a photosensitive silver halide layer to form a thin-wire structure portion containing a conductive metal on the support; and combining the thin-wire structure portion with a transparent conductive layer.

[35] A method according to [34], wherein the thin-wire structure portion in an electrode region contains a silver at an Ag/binder volume ratio of 1/4 or more.

[36] A method according to [34], further comprising subjecting the thin-wire structure portion to a compression treatment.

[37] A method according to [36], wherein the compression treatment is carried out using a calender roll unit.

[38] A method according to [36], wherein the compression treatment is carried out at a line pressure of 1980 N/cm (200 kgf/cm) or more.

[39] A method according to [36], wherein the compression treatment is carried out at a line pressure of 2960 N/cm (300 kgf/cm) or more.

[40] A method according to [36], wherein the compression treatment is carried out at a line pressure of 6860 N/cm (700 kgf/cm) or less.

[41] An electroluminescence device according to a sixth aspect of the present invention, comprising the above transparent conductive film.

[42] A transparent electrode for a solar cell according to a seventh aspect of the present invention, comprising the above transparent conductive film.

[43] A transparent electrode for an electronic paper according to an eighth aspect of the present invention, comprising the above transparent conductive film.

As described above, the self-luminous display device of the present invention contains the electrode region having high light transmittance, low surface resistivity, and excellent flexibility, and thereby can be suitably used in a flexible display such as inorganic EL, organic EL, or electronic paper. Thus, such a flexible display can be more readily mass-produced by using the self-luminous display device.

The transparent conductive film of the present invention has high light transmittance, low surface resistivity, and excellent flexibility, and thereby is suitable for driving voltage reduction, durability improvement, and in-plane luminance equalization in a large-area electroluminescence device, power output efficiency improvement in a solar cell, etc., and driving voltage reduction and power consumption reduction in a flexible display such as an electronic paper.

The transparent conductive film of the present invention having the transparent conductive layer and the thin-wire structure portion containing the compression-treated conductive metal can satisfy both the conditions of high transmittance and low surface resistivity. Further, the transparent conductive film having such advantageous effects can be mass-produced at low cost. Thus, in the present invention, the transparent conductive film can be mass-produced by using a transparent conductive material or the like in the conductive layer.

The ITO layer does not have a sufficiently low surface resistance. In contrast, since the conductive layer and the thin-wire structure portion are used in combination, the transparent conductive film of the present invention can have a low surface resistance and can be formed at low cost, and thereby can be utilized in an inorganic EL, a solar cell, etc.

Even in the case of using the transparent conductive film in a large-size EL device, the luminance of the device is hardly lowered by the transparent conductive film since the thin-wire structure portion has a surface resistance lower than that of the ITO layer. An electrode busbar is not necessary in the present invention though it is necessary for the ITO layer.

Furthermore, the transparent conductive film can be used as a low-resistance electrode in a flexible display such as an electronic paper. In this case, the transparent conductive film contributes to the reduction of voltage and power consumption. The transparent conductive film of the present invention is excellent in flexibility and can be produced roll-to-roll. Therefore, any product using the transparent conductive film can be produced at a remarkably lower process cost.

BEST MODE FOR CARRYING OUT THE INVENTION

A preferred embodiment of the present invention will be described below.

Figure 1:
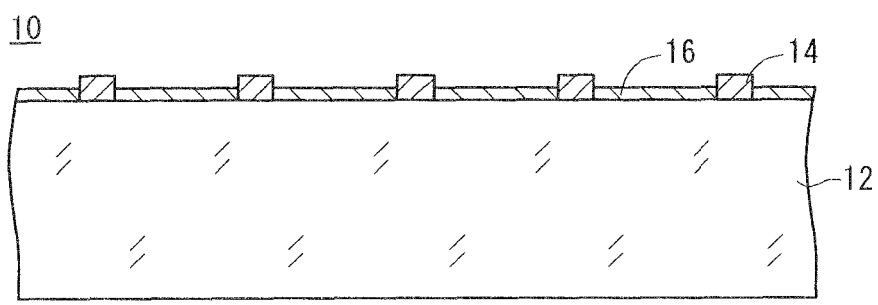
FIG. 1 is a cross-sectional view partly showing the structure of a transparent conductive film according to an embodiment of the present invention.

As shown in FIG. 1, a transparent conductive film 10 according to this embodiment has a transparent support 12, and a thin-wire structure portion 14 containing a conductive metal and a light-transmitting conductive layer 16 are formed on the support 12.

Figure 2:
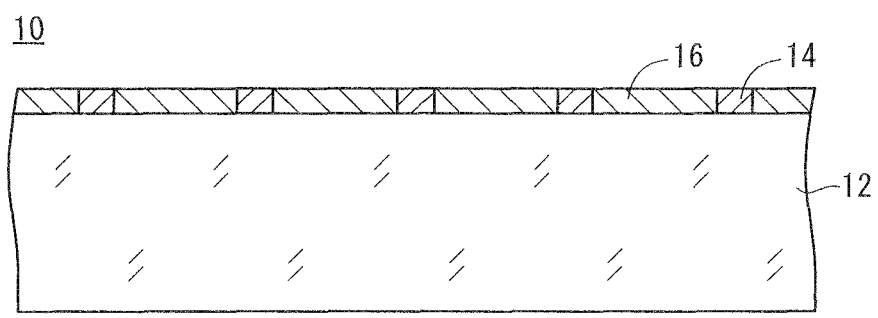
FIG. 2 is a cross-sectional view partly showing a first modification example of the transparent conductive film of the embodiment.
Figure 3:
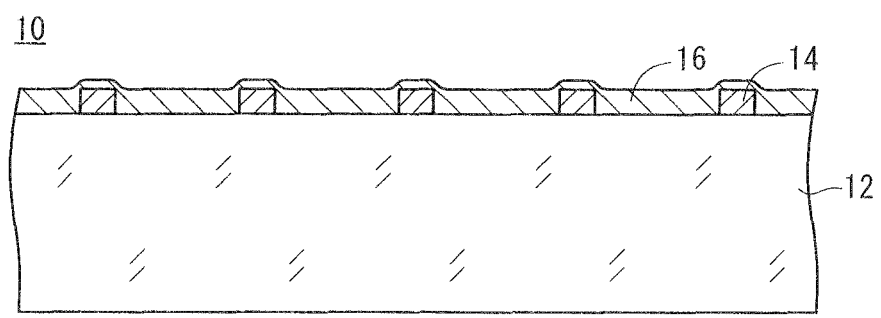
FIG. 3 is a cross-sectional view partly showing a second modification example of the transparent conductive film of the embodiment.

In FIG. 1, the thickness (height) of the thin-wire structure portion 14 is larger than that of the conductive layer. As shown in FIGS. 2 and 3, the thickness (height) of the thin-wire structure portion 14 may be approximately the same as that of the conductive layer 16. In this case, the upper surface of the thin-wire structure portion 14 may be exposed as shown in FIG. 2, and the upper surface may be covered with the conductive layer 16 as shown in FIG. 3.

Figure 4:
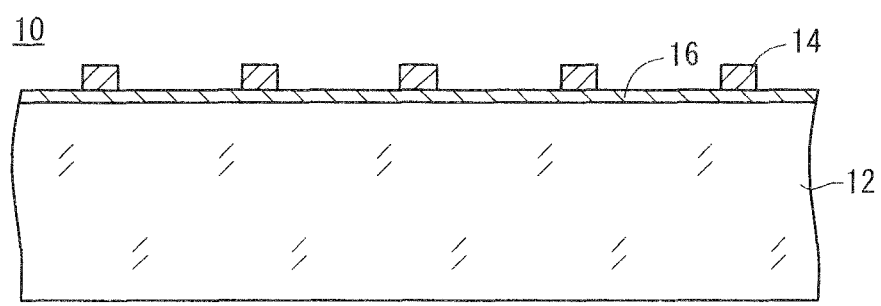
FIG. 4 is a cross-sectional view partly showing a third modification example of the transparent conductive film of the embodiment.
Figure 5:
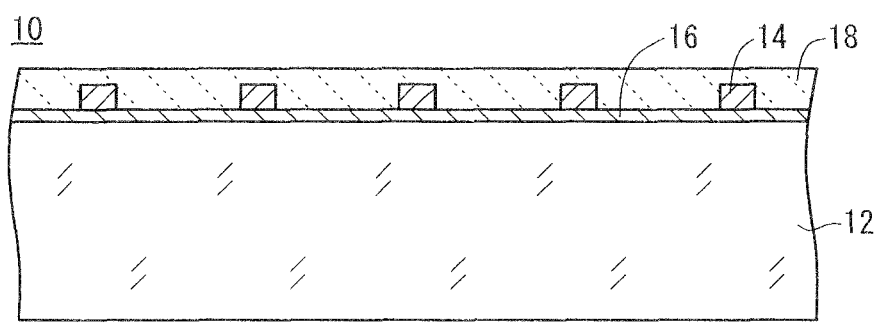
FIG. 5 is a cross-sectional view partly showing a fourth modification example of the transparent conductive film of the embodiment.

Alternatively, as shown in FIG. 4, the conductive layer 16 may be formed on an entire surface of the support 12, and the thin-wire structure portion 14 may be formed on the conductive layer 16 in a wiring pattern. In this case, as shown in FIG. 5, a protective layer 18 or another conductive layer, having a thickness (height) larger than that of the thin-wire structure portion 14, may be formed.

Figure 6:
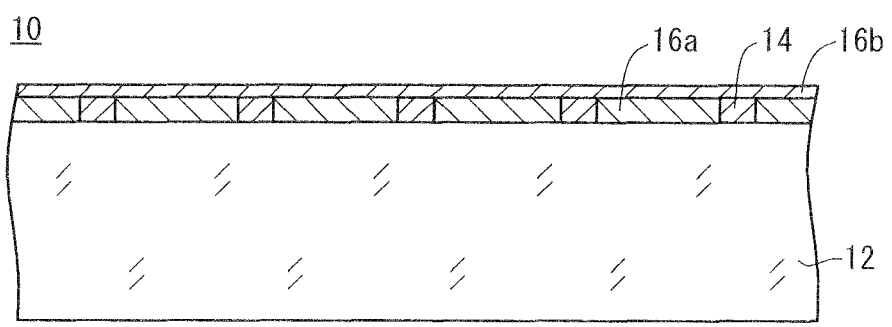
FIG. 6 is a cross-sectional view partly showing a fifth modification example of the transparent conductive film of the embodiment.

As shown in FIG. 6, a high-resistance first conductive layer 16a and the wiring-patterned thin-wire structure portion 14 may be formed on the support 12, and a low-resistance second conductive layer 16b or a protective layer may be formed on an entire surface of the first conductive layer 16a and the thin-wire structure portion 14.

Figure 7:
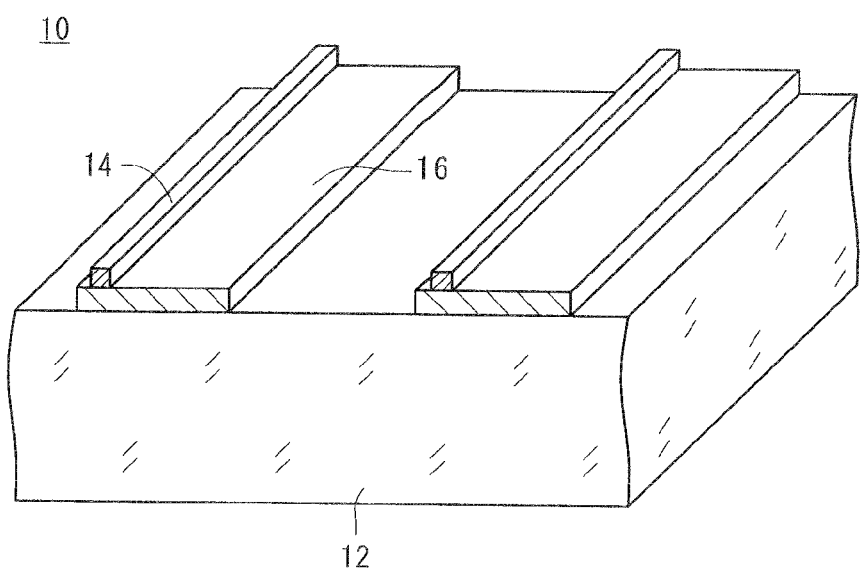
FIG. 7 is a perspective view partly showing a sixth modification example of the transparent conductive film of the embodiment.

Furthermore, as shown in FIG. 7, a plurality of the conductive layers 16 may be formed in a stripe pattern on the support 12, and the thin-wire structure portion 14 may be formed in the vicinity of a width-direction edge of the upper surface of each conductive layer 16 along the longitudinal direction of the conductive layer 16. For example, the thin-wire structure portion 14 may be formed on the left or right edge of each conductive layer 16 as shown in FIG. 7, and may be formed on both the width-direction edges.

Figure 12A:
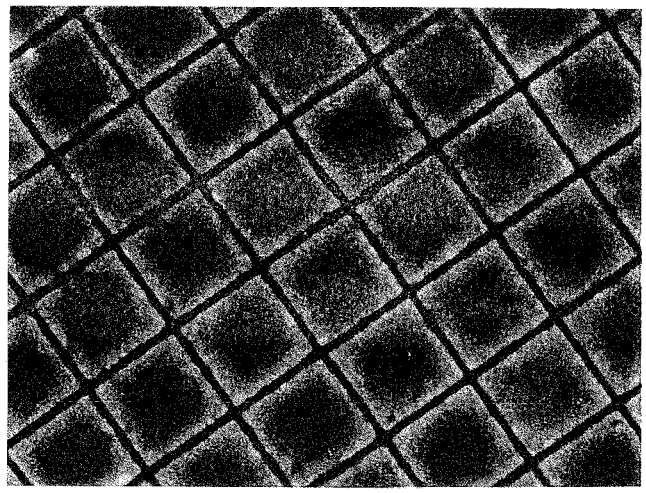
FIG. 12A is a view of light emission only in the vicinity of thin wires in a thin-wire structure portion.
Figure 12B:
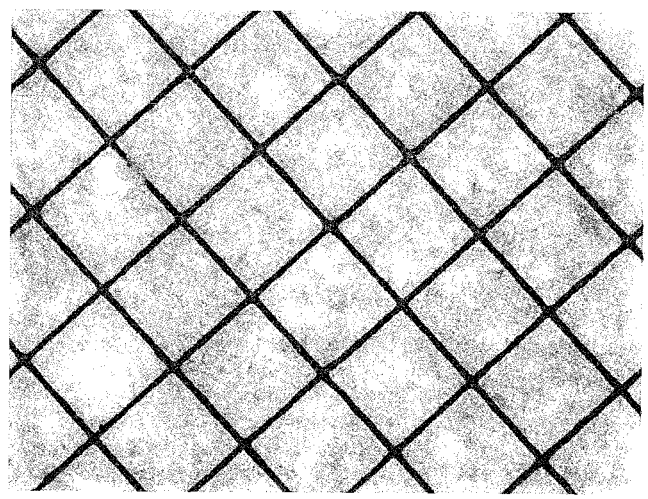
FIG. 12B is a view of light emission over the entire surface.

For example, the wiring pattern of the thin-wire structure portion 14 may be a mesh pattern shown in FIGS. 12A and 12B. Further, the wiring pattern may be a pattern of arranged hexagons, a pattern of arranged triangles, a pattern of arranged polygons, a stripe pattern (a lattice pattern), etc. Of course each thin wire may be a straight line or a wavy line (such as a sine curve line).

Figure 8:
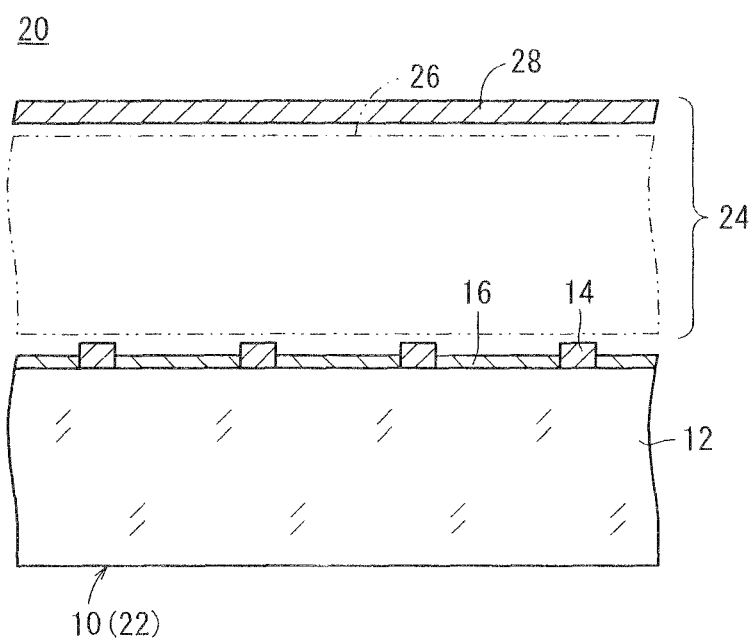
FIG. 8 is a cross-sectional view partly showing the structure of a self-luminous display device according to the embodiment.

In the case of using the transparent conductive film 10 of the embodiment for a self-luminous display device 20, for example, as shown in FIG. 8, the transparent conductive film 10 is used as a first electrode region 22 (e.g. a positive electrode), and a display region 24 is disposed on the first electrode region 22. The display region 24 may have a light-emitting layer 26 (which contains an inorganic substance such as zinc sulfide or an organic substance such as a diamine) formed on the upper surface of the first electrode region 22 (the surface having the thin-wire structure portion 14), and may further have a second electrode region 28 (e.g. a negative electrode) disposed on the light-emitting layer 26. Of course, the self-luminous display device according to this embodiment can be used not only for image display purpose but also for lighting purpose.

In the present invention, a conductive material used in the thin-wire structure portion and a transparent conductive material used in the opening portion each have an optimum resistance range suitable for effective light emission. It is preferred that the thin-wire structure portion has a volume resistance of $10^{-4}$ Ω·cm or less from the viewpoint of utilizing its high conductivity. It is preferred that the transparent conductive material in the opening portion preferably has a surface resistance of 1000 Ω/sq or more singly from the viewpoint of reducing light loss due to this material. Within the range, the transparent conductive layer can exhibit low resistance, low power loss, and high transparency.

Particularly in the first electrode region 22 of this embodiment, the thin-wire structure portion 14 has a volume resistance of $10^{-4}$ Ω·cm or less, and the conductive layer 16 has a volume resistance of 0.05 Ω·cm or more.

Further, in the first electrode region 22, the thin-wire structure portion 14 has a surface resistance of 100 Ω/sq or less, and the conductive layer 16 has a surface resistance of 1000 Ω/sq or more. The surface resistances of the thin-wire structure portion 14 and the conductive layer 16 are measured based on a measurement method according to JIS K6911.

When the first electrode region 22 has a surface resistance R1 before a bending test to be hereinafter described and has a surface resistance R2 after the bending test, the first electrode region 22 satisfies the relation of R2/R1<18.

Figure 11:
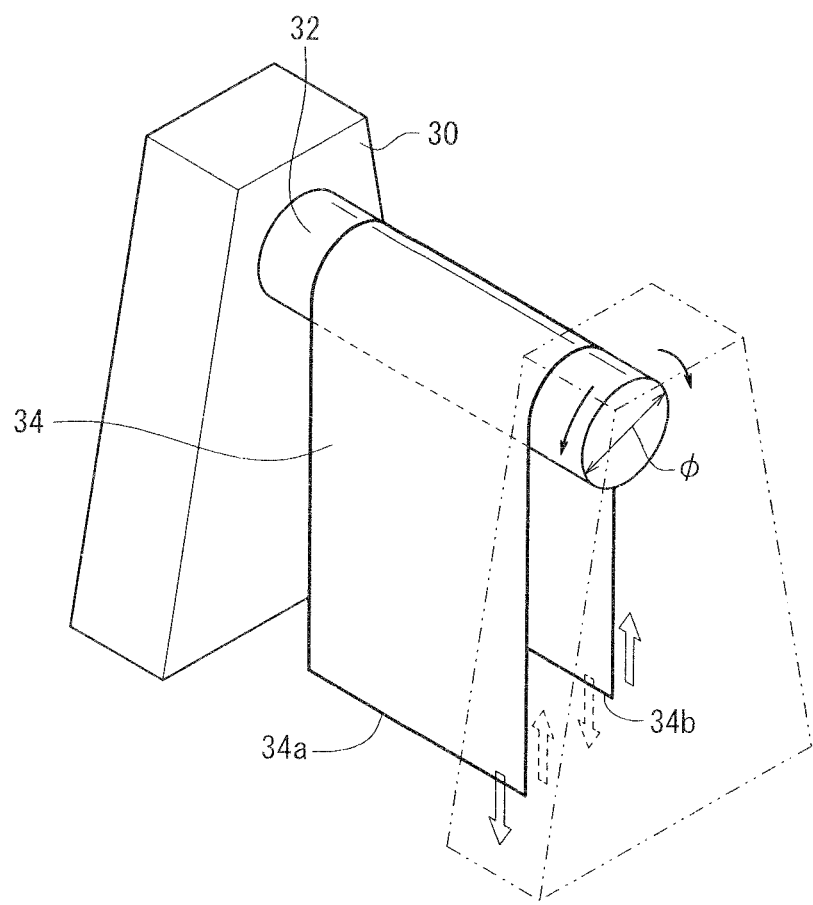
FIG. 11 is a view for explaining a bending test.

In the bending test, for example, as shown in FIG. 11, a roller 32 having a diameter φ of 4 mm is rotatably attached to a base 30. A long sample 34 (the first electrode region 22) is placed on the roller 32, and is bent 100 times by repeating a process of rotating the roller 32 while pulling one end 34a of the sample 34 at a tension of 28.6 (kg/m) and a process of rotating the roller 32 while pulling the other end 34b of the sample 34 at a tension of 28.6 (kg/m).

When the above relation is satisfied, the self-luminous display device 20 of the embodiment contains the first electrode region 22 with high light transmittance, low surface resistance, and excellent flexibility, and thereby can be suitably used in a flexible display such as inorganic EL, organic EL, or electronic paper. Thus, such a flexible display can be more readily mass-produced by using the self-luminous display device 20.

The transparent conductive film 10 of the present invention has high light transmittance, low surface resistance, and excellent flexibility, and thereby is suitable for driving voltage reduction, durability improvement, and in-plane luminance equalization in a large-area electroluminescence device, power output efficiency improvement in a solar cell, etc., and driving voltage reduction and power consumption reduction in a flexible display such as an electronic paper.

Particularly by subjecting the thin-wire structure portion 14 to a compression treatment to be hereinafter described, the resultant transparent conductive film 10 can satisfy both the conditions of high transmittance and low surface resistance.

Further, the transparent conductive film 10 having such advantageous effects can be mass-produced at low cost. Thus, in the present invention, the transparent conductive film can be mass-produced by using the transparent conductive material or the like in the conductive layer.

The ITO layer does not have a sufficiently low surface resistance. In contrast, since the conductive layer and the thin-wire structure portion are used in combination, the transparent conductive film of the present invention can have a low surface resistance and can be formed at low cost, and thereby can be utilized in an inorganic EL, a solar cell, etc.

Even in the case of using the transparent conductive film in a large-size EL device, the luminance of the device is hardly lowered by the film since the thin-wire structure portion 14 has a surface resistance lower than that of the ITO layer. An electrode busbar is not necessary in the present invention though it is necessary for the ITO layer.

Furthermore, the transparent conductive film can be used as a low-resistance electrode in a flexible display such as an electronic paper. In this case, the transparent conductive film contributes to the reduction of voltage and power consumption. The transparent conductive film 10 of this embodiment is excellent in flexibility and can be produced roll-to-roll. Therefore, any product using the transparent conductive film 10 can be produced at a remarkably lower process cost.

The preferred embodiment will be further described below.

The conductive layer 16 in the transparent conductive film 10 (the first electrode region 22) of this embodiment preferably contains a conductive material. In this case, the conductive material preferably contains a conductive transparent organic polymer or a conductive fine particle. The conductive fine particle preferably contains a conductive metal oxide, a conductive fine metal particle, or a carbon nanotube.

In this embodiment, the thin-wire structure portion 14 may contain a conductive metallic silver generated by exposing and developing a photosensitive layer containing at least a photosensitive silver salt layer on the support 12. In this case, the thin-wire structure portion 14 may be formed by exposing and developing a photosensitive material comprising the support 12 and thereon the photosensitive silver salt layer to form a conductive metallic silver portion and a light-transmitting portion. The light-transmitting portion may be substantially free of physical development nuclei. The thin-wire structure portion 14 preferably contains a silver, and the volume ratio of Ag/binder therein is preferably 1/4 or more. The Ag/binder volume ratio is preferably 0.1/1 to 10/1, more preferably 0.25/1 to 4/1, further preferably 0.7/1 to 4/1, still further preferably 1/1 to 3.50/1.

A production method for forming the thin-wire structure portion 14 on the support 12 will be described below with reference to FIGS. 9A to 9E.

Figure 9A:
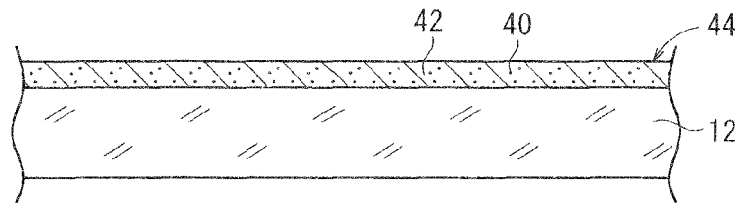
FIGS. 9A to 9E are views showing the processes of a production method for forming a thin-wire structure portion on a support.

First, as shown in FIG. 9A, the support 12 is coated with a photosensitive silver salt layer 44, which is prepared by mixing a silver halide 40 (e.g., silver bromide particles, silver chlorobromide particles, silver iodobromide particles) with a gelatin 42. Though the silver halide 40 is exaggeratingly shown as particles in FIGS. 9A to 9C to facilitate understanding, the size, concentration, etc. of the silver halide 40 are not limited to the drawings.

Figure 9B:
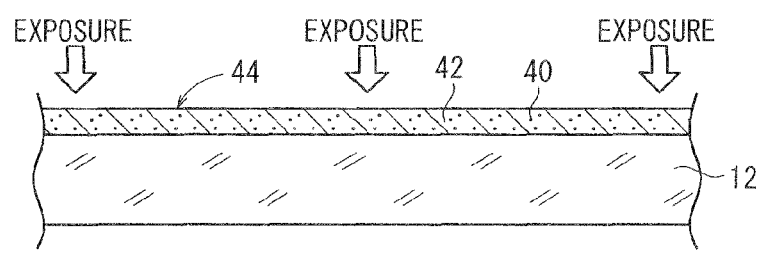

Then, as shown in FIG. 9B, the photosensitive silver salt layer 44 is subjected to an exposure treatment for forming the thin-wire structure portion 14. When an optical energy is applied to the silver halide 40, a minute silver nucleus (a latent image), invisible to the naked eye, is generated.

Figure 9C:
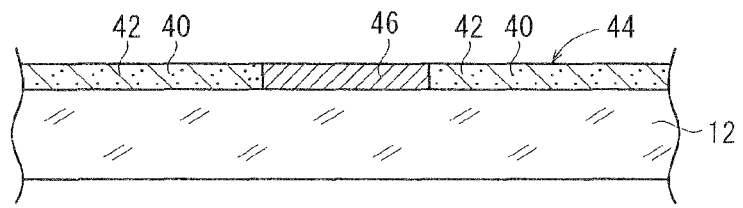

As shown in FIG. 9C, a development treatment is carried out to convert the latent image to an image visible to the naked eye. Specifically, the photosensitive silver salt layer 44 having the latent image is developed using a developer, which is an alkaline or acidic solution, generally an alkaline solution. In the development treatment, using the latent image silver nucleus as a catalyst core, a silver ion supplied from the silver halide or the developer is reduced to a metallic silver by a reducing agent, called a developing agent, in the developer. As a result, the latent image silver nucleus is grown to form a visible silver image (a developed silver 46).

Figure 9D:
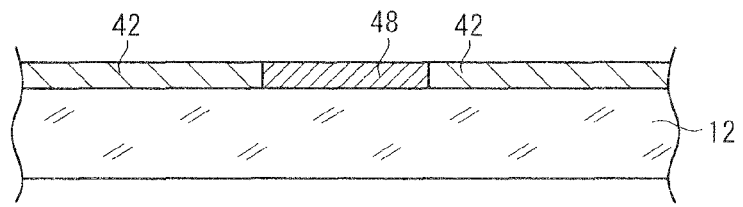

The photosensitive silver halide 40 remains in the photosensitive silver salt layer 44 after the development treatment. As shown in FIG. 9D, the residual silver halide 40 is removed by a fixation treatment using a fixer, which is an acidic or alkaline solution, generally an acidic solution.

After the fixation treatment, a metallic silver portion 48 is formed in an exposed area, and only the gelatin 42 remains in an unexposed area as a light-transmitting portion.

In a case where silver bromide is used as the silver halide 40 and a thiosulfate salt is used in the fixation treatment, a reaction represented by the following formula proceeds in the treatment.

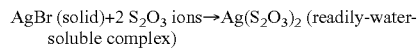

$$AgBr\ (solid) + 2\ S_2O_3\ ions \rightarrow Ag(S_2O_3)_2\ (readily\text{-}water\text{-}soluble\ complex)$$

Two thiosulfate $S_2O_3$ ions and a silver ion in the gelatin 42 (from AgBr) are reacted to generate a silver thiosulfate complex. The silver thiosulfate complex has high water solubility, and thereby is eluted from the gelatin 42. As a result, the developed silver 46 is fixed as the metallic silver portion 48.

Thus, the latent image is reacted with the reducing agent to deposit the developed silver 46 in the development treatment, and the residual silver halide 40, not converted to the developed silver 46, is eluted into water in the fixation treatment. The treatments are described in detail in T. H. James, "*The Theory of the Photographic Process, 4th ed.*", Macmillian Publishing Co., Inc., NY, Chapter 15, pp. 438-442, 1977.

It is preferred that the photosensitive silver salt layer 44 is neutralized or acidified by a quencher such as an acetic acid solution after the development treatment before the fixation treatment.

Figure 9E:
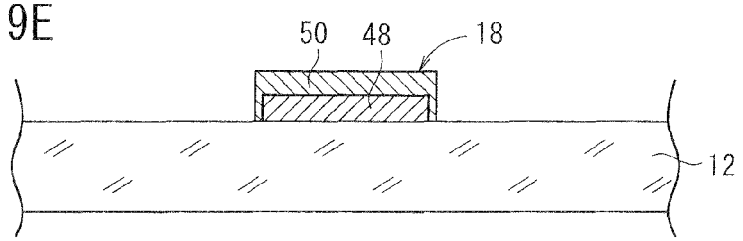

For example, as shown in FIG. 9E, the residual gelatin is removed by a heat treatment, and a metal layer 50 is disposed only on the surface of the metallic silver portion 48 by a plating treatment (an electroless plating treatment, an electroplating treatment, or a combination thereof). Thus, the thin-wire structure portion 14 containing the metallic silver portion 48 and thereon the metal layer 50 is formed on the support 12.

The difference between the above mentioned process using the photosensitive silver salt layer 44 (a silver salt photography technology) and a process using a photoresist (a resist technology) will be described below.

In the resist technology, a photopolymerization initiator absorbs a light in an exposure treatment to initiate a reaction, a photoresist film (a resin) per se undergoes a polymerization reaction to increase or decrease the solubility in a developer, and the resin in an exposed or unexposed area is removed in a development treatment. The developer used in the resist technology may be an alkaline solution free of reducing agents, in which an unreacted resin component can be dissolved. On the other hand, as described above, in the silver salt photography technology according to the present invention, the minute silver nucleus, the so-called latent image, is formed from the silver ion and a photoelectron generated in the silver halide 40 exposed in the exposure treatment. The latent image silver nucleus is grown to form the visible silver image in the development treatment using the developer, which must contain the reducing agent (the developing agent). Thus, the resist technology and the silver salt photography technology are greatly different in the reactions in the exposure and development treatments.

In the development treatment of the resist technology, the unpolymerized resin portion in the exposed or unexposed area is removed. On the other hand, in the development treatment of the silver salt photography technology, using the latent image as the catalyst core, the reduction reaction is conducted by the reducing agent (the developing agent) contained in the developer, and the developed silver 46 is grown into a visible size. The gelatin 42 in the unexposed area is not removed in the silver salt photography technology. Thus, the resist technology and the silver salt photography technology are greatly different also in the reactions in the development treatments.

The silver halide 40 contained in the gelatin 42 in the unexposed area is eluted in the following fixation treatment, and the gelatin 42 is not removed as shown in FIG. 9D.

The main reaction component (the photosensitive component) is the silver halide in the silver salt photography technology, while it is the photopolymerization initiator in the resist technology. Further, in the development treatment, the binder (the gelatin 42) remains in the silver salt photography technology as shown in FIG. 9D, while it is removed in the resist technology. The resist technology and the silver salt photography technology are greatly different in these points.

It is preferred that the thin-wire structure portion 14 is formed by the steps of exposing and developing the photosensitive material comprising the support 12 and thereon the photosensitive silver salt layer, subjecting the material to a compression treatment at least once, subjecting the material to the fixation treatment, and further subjecting the fixed material to a compression treatment at least once. In this case, it is preferred that the compression treatment is carried out after the photosensitive layer is exposed, developed, water-washed, and dried, and further after the photosensitive layer is fixed, water-washed, and dried. The compression treatment may be carried out using a calender roll unit.

In the formation of the thin-wire structure portion 14, it is preferred that at least one treatment of physical development, electrolytic plating, and electroless plating treatments is carried out between the development and drying steps.

The transparent conductive film 10 (the first electrode region 22) may be obtained by forming the thin-wire structure portion 14 and by bonding the thin-wire structure portion 14 to the conductive layer 16.

A specific structure example of the transparent conductive film 10 (the first electrode region 22) according to this embodiment will be described below.

It should be noted that, in the present invention, a numeric range of "A to B" includes both the numeric values A and B as the lower limit and upper limit values.

[Support 12]

The support 12 is not particularly limited as long as it is light transmittable. The support 12 preferably has a high light transmittance. The light-transmitting support 12 may be colored as long as it does not interfere with the advantageous effects of the present invention. In this embodiment, the total visible light transmittance of the support 12 is preferably 70% to 100%, more preferably 85% to 100%, particularly preferably 90% to 100%.

The support 12 may be a plastic film.

Examples of materials for the plastic film include polyesters such as polyethylene terephthalates (PET) and polyethylene naphthalates; polyolefins such as polyethylenes (PE), polypropylenes (PP), polystyrenes, and EVA; vinyl resins such as polyvinyl chlorides and polyvinylidene chlorides; polyether ether ketones (PEEK); polysulfones (PSF); polyether sulfones (PES); polycarbonates (PC); polyamides; polyimides; acrylic resins; and triacetyl celluloses (TAC).

In this embodiment, it is preferred that the plastic film contains a polyethylene terephthalate (PET) or a polyethylene naphthalate (PEN) from the viewpoints of transparency, heat resistance, handling, and cost.

The transparent conductive film 10 has to be transparent. Thus, the support 12 preferably has a high transparency. The total visible light transmittance of the plastic film is preferably 70% to 100%, more preferably 85% to 100%, particularly preferably 90% to 100%. In this embodiment, the plastic film may be colored as long as it does not interfere with the advantageous effects of the present invention.

In this embodiment, the plastic film may have a monolayer structure or a multilayer structure containing 2 or more layers.

To improve the light resistance, an ultraviolet absorber may be kneaded into a base of the plastic film, and a barrier layer, an antireflection layer, or a hard coating layer may be formed on the plastic film.

In this embodiment, a glass plate may be used as the support 12, and the type of the glass plate is not particularly limited. In a case where the glass plate is used in a conductive film for a display, the glass plate is preferably composed of a reinforced glass having a reinforcing layer on a surface. The reinforced glass can be prevented from breakage more easily as compared with unreinforced glasses. Further, a reinforced glass obtained by air cooling is preferred from the safety viewpoint. If broken, such a reinforced glass is divided into significantly small fragments having unsharp edges.

[Thin-wire Structure Portion 14]

In this embodiment, the thin-wire structure portion 14 containing a metal and/or alloy is formed in a uniform pattern of network, comb, grid, etc. in addition to the transparent conductive layer 16, and the thin-wire structure portion 14 may be subjected to the compression treatment to form a conductive surface for improving the conductivity.

The thin wire of the metal or alloy (referred to as a metal wiring) preferably contains copper, silver, or aluminum, and may contain the above described transparent conductive material in accordance with the intended use. The metal wiring is preferably composed of a material with high electrical conductivity and high thermal conductivity. The metal wiring may be subjected to a plating treatment to form a plated metal. The width of the metal wiring is preferably about 0.1 to 30 µm, though not restrictive. Lines of the metal wiring are preferably arranged at a pitch of 20 to 300 µm. The light transmittance of the transparent conductive film 10 is reduced by the thin-wire structure portion containing the metal and/or alloy. It is important to minimize the reduction, thereby preferably achieving a light transmittance of 70% or more. Thus, the line distance of the metal wiring is not excessively reduced, and the width and height of the metal wiring are not excessively increased. In this embodiment, the transmittance for a 550-nm light of the transparent conductive film 10 is preferably 70% or more, more preferably 80% or more, most preferably 90% or more.

In the case of using the transparent conductive film 10 of this embodiment in an EL device, the light transmittance of the transparent conductive film 10 within a wavelength range of 420 to 650 nm is preferably 70% or more, more preferably 80% or more, in view of improving the luminance and achieving white light emission. Further, the light transmittance of the transparent conductive film 10 within a wavelength range of 380 to 680 nm is more preferably 80% or more, most preferably 90% or more, in view of achieving the white light emission. The light transmittance of the transparent conductive film 10 can be measured by a spectrophotometer.

The thin-wire structure portion 14 containing the metal and/or alloy preferably has a height (thickness) of 0.1 to 10 μm. The height is particularly preferably 0.1 to 2 μm, most preferably 0.1 to 1 μm. Each of the thin-wire structure portion 14 containing the metal and/or alloy and the conductive layer 16 may be exposed. The height difference between the opening and the protrusion in the thin-wire structure portion 14 is preferably 5 μm or less, most preferably substantially zero.

The height of the conductive surface is an average amplitude of the protrusion and depression, obtained by measuring a 5-mm-square sample using a three-dimensional surface roughness meter (e.g. SURFCOM 575A-3DF manufactured by Tokyo Seimitsu Co., Ltd.) When the height cannot be obtained under the resolution capability of the surface roughness meter, an STM or an electron microscope may be used in the measurement.

At least part of the thin-wire structure portion 14 is preferably subjected to a blackening treatment. By the blackening treatment, a black layer having an antirust property and an antireflection property can be formed. The blackening-treated thin-wire structure portion 14 has the antireflection property, whereby light reflection on the thin-wire structure portion 14 can be prevented even though the metal wiring has a high reflectance.

The blackening treatment is disclosed in Japanese Laid-Open Patent Publication No. 2003-188576, etc. In general, the blackening treatment may be an electrolytic plating treatment using a conductive metal compound (such as a compound or an alloy of nickel Ni, zinc Zn, copper Cu, etc.), a plating treatment for forming a black coating, or a treatment with an ionic, high-molecular, electrodeposition material such as an electrodeposition coating material. For example, a Co—Cu alloy plating treatment may be carried out to form the black layer capable of preventing reflection on the metal surface, and a chromate treatment may be further carried out to obtain the antirust property. In the chromate treatment, the thin-wire structure portion 14 is immersed in a solution containing a chromate or dichromate salt as a main component, and then dried to form an antirust coating.

In this embodiment, an electrolytic solution bath for the blackening treatment (a black plating bath) may contain nickel sulfate as a main component. The black plating bath may be a commercially available bath, and specific examples thereof include an Sn—Ni alloy-based black plating bath NOBLOY SNC (trade name) available from Shimizu Co., Ltd., an Sn—Ni alloy-based black plating bath NIKKA BLACK (trade name) available from Nihon Kagaku Sangyo Co., Ltd., and a Cr-based black plating bath EBONY CHROME 85 series (trade name) available from Kinzoku Kagaku Kogyo Co., Ltd. Further, in this embodiment, the black plating bath may contain Zn, Cu, or the like. A blackening agent for the metal surface can be easily prepared using a sulfide compound, and can be selected from various commercially available products. Examples thereof include COPPER BLACK CuO, COPPER BLACK CuS, and selenium-based COPPER BLACK No. 65 (trade names) available from Isolate Kagaku Kenkyusho, and EBONOL C SPECIAL (trade name) available from Meltex Inc.

The thin-wire structure portion 14 is preferably formed by a silver salt photographic method containing chemically developing silver halide particles into a desired wiring pattern, though the formation method is not particularly limited. A developed silver is obtained by the silver salt photographic method in the state of an aggregate of metallic silver filaments. The aggregate is formed in the chemical development or formed by bonding or fusing the metallic silver filaments each other.

The developed silver may be obtained by using principles and techniques widely known in the silver salt photography field. For example, methods described in Japanese Laid-Open Patent Publication No. 2004-221564 can be used in the present invention.

The developed silver can have conductivity sufficient for use as a cathode in electrolytic plating, and thereby can be electrolytic-plated. Further the developed silver can be used as an electroless plating catalyst, and thereby can be electroless-plated. Thus, the developed silver may be plated with another metal such as high-conductive copper, to obtain the thin-wire structure portion 14 containing the developed silver, the plating metal, and inevitable impurities. The developed silver can be easily blackened because of the plating properties.

The wiring pattern of the thin-wire structure portion 14 is not particularly limited, and may be appropriately selected depending on the intended use. As described above, the wiring pattern may be a mesh pattern, a pattern of arranged hexagons, a pattern of arranged triangles, a pattern of arranged polygons, a stripe pattern (a lattice pattern), etc. Of course, each thin wire may be a straight line or a wavy line (such as a sine curve line).

The thickness of the metal wiring may be appropriately selected depending on the intended use, and is preferably 0.2 μm or more in view of obtaining high conductivity. In terms of the upper limit, as described above, the thickness is preferably 10 μm or less, more preferably 2 μm or less, particularly preferably 1 μm or less.

Also the line width of the wiring pattern may be appropriately selected depending on the intended use, and is preferably 1 μm or more in view of obtaining high conductivity. When the line width is too large, the wiring pattern is visible to cause a problem in a light-transmitting material. Thus, the line width of the wiring pattern is preferably 1 to 30 μm, more preferably 2 to 20 μm or less, further preferably 4 to 18 μm or less.

[Conductive Layer 16]

The conductive layer 16 may be formed by uniformly applying a conductive transparent organic polymer (such as a PEDOT/PSS, a polyaniline, a polypyrrole, a polythiophene, or a polyisothianaphthene), a conductive metal (such as a metal oxide, a fine metal particle, a metal nanorod, or a nanowire), a conductive inorganic fine particle (such as a carbon nanotube), or an organic water-soluble salt to a transparent film composed of a polyethylene terephthalate, a polyethylene naphthalate, etc. using a coating method, a printing method, or the like. In a coating liquid of such a conductive component, a non-conductive polymer, a latex, etc. may be blended to improve the coating properties or to control the layer properties. The conductive layer 16 may have a multilayer structure containing high-refractive layers and a thin silver layer sandwiched therebetween. The transparent conductive materials are described in Toray Research Center, Inc., "Present and Future of Electromagnetic Wave-Shielding Material", Japanese Laid-Open Patent Publication No. 9-147639, etc. In the coating and printing methods, a coater such as a slide coater, a slot die coater, a curtain coater, a roll coater, a bar coater, or a gravure coater, a screen printer, etc. is used.

In this embodiment, the thin-wire structure portion 14 containing the metal and/or alloy is formed in a uniform pattern of network, stripe, comb, grid, etc. in addition to the conductive layer 16, whereby the conductive surface is formed to improve the conductivity.

The transparent conductive film 10 of this embodiment may be produced by separately preparing the network-patterned thin-wire structure portion 14 containing the metal and/or alloy and a transparent film having the conductive layer 16, and by stacking them.

The transparent conductive film 10 may be produced not by bonding the thin-wire structure portion 14 and the conductive layer 16, but by the steps of forming the network-patterned thin-wire structure portion 14 containing the metal and/or alloy on a transparent film, and uniformly applying a dispersion of the transparent conductive material using a vapor deposition method, a coating method, a printing method, etc. to form the transparent conductive film 10. In this case, the roughness of the network-patterned thin-wire structure portion 14 containing the metal and/or alloy is reduced by the dispersion of the transparent conductive material, thereby providing a relatively uniform flat structure. Alternatively, the transparent conductive film 10 may be produced by the steps of forming the layer of the transparent conductive material on the transparent film, and disposing the thin-wire structure portion 14 thereon.

In any case, it is preferred that an intermediate layer composed of an organic high-molecular material is used or a surface treatment is carried out to improve the adhesion between the transparent film and the thin-wire structure portion 14 containing the metal and/or alloy or between the transparent film and the conductive layer 16.

The thin-wire structure portion 14 containing the metal and/or alloy can be prevented from coming into direct contact with another layer, and the surface roughness of the transparent conductive film 10 can be reduced, whereby the transparent conductive film 10 can be easily connected to a layer formed thereon such as an electroluminescence layer or a current injection layer uniformly. Additionally the stability of the self-luminous display device 20 can be improved.

The thin-wire structure portion 14 having the metallic silver portion and the light-transmitting portion, and the conductive layer 16 containing the conductive material may be formed by exposing and developing a photosensitive material comprising the support 12 and thereon a photograph-constituting layer. The photograph-constituting layer contains at least a photosensitive silver halide layer and a conductive material-containing layer.

The conductive layer 16 may be formed by stacking a first layer containing a conductive polymer and a second layer containing an insulating polymer as a main component. The conductive layer 16 may contain a mixture of the conductive polymer and the insulating polymer. By using such a structure, the amount of an expensive conductive polymer can be reduced, and therefore the price of the product can be reduced. In the case of using the mixture of the conductive polymer and the insulating polymer, the conductive polymer may be blended with another binder at a conductive polymer/binder ratio of 10%/90%. The conductive polymer content is preferably 50% or more, more preferably 70% or more, further preferably 80% or more, by mass.

When the conductive layer 16 contains the mixture of the conductive polymer and the insulating polymer, the conductive polymer may be uniformly distributed or spatially non-uniformly distributed. In the nonuniform distribution, it is preferred that the conductive polymer content is increased in the vicinity of the upper surface of the conductive layer 16. When the first layer (mainly composed of the conductive polymer) and the second layer (mainly composed of the insulating polymer) are stacked, it is preferred that the second layer is thicker than the first layer from the viewpoint of cost reduction.

The conductive polymer is preferably high in light transmittance and conductivity, and preferred examples thereof include electron-conductive polymers such as polythiophenes, polypyrroles, and polyanilines.

The electron-conductive polymer may be a polymer known in the art such as a polyacetylene, a polypyrrole, a polyaniline, or a polythiophene. The electron-conductive polymer is described in detail in, for example, "*Advances in Synthetic Metals*", ed. P. Bernier, S. Lefrant, and G. Bidan, Elsevier, 1999; "*Intrinsically Conducting Polymers: An Emerging Technology*", Kluwer (1993); "*Conducting Polymer Fundamentals and Applications, A Practical Approach*", P. Chandrasekhar, Kluwer, 1999; and "*Handbook of Organic Conducting Molecules and Polymers*", Ed. Walwa, Vol. 1-4, Marcel Dekker Inc. (1997). Those skilled in the art will readily appreciate that also novel electron-conductive polymers to be developed in future can be used in the present invention. The electron-conductive polymer may be used singly or as a blend of a plurality of the polymers.

The insulating polymer may be an acrylic resin, an ester resin, a urethane resin, a vinyl resin, a polyvinyl alcohol, a polyvinyl pyrrolidone, a gelatin, etc, and is preferably an acrylic resin or a polyurethane resin, particularly an acrylic resin.

The conductive layer 16 may contain a conductive metal oxide particle, a binder, etc. The conductive metal oxide may be tin oxide, $SnO_2$ doped with antimony, indium tin oxide (ITO), zinc oxide, tin oxide doped with fluorine, zinc oxide doped with gallium, etc.

The binder may be an acrylic resin, an ester resin, a urethane resin, a vinyl resin, a polyvinyl alcohol, a polyvinyl pyrrolidone, a gelatin, etc., and is preferably an acrylic resin or a polyurethane resin, particularly an acrylic resin.

The conductive layer 16 is preferably crosslinked to improve the water resistance and solvent resistance. When the conductive polymer per se does not have crosslinking reactivity, it is preferred that the binder has crosslinking reactivity, and a functional group thereof can be crosslinking-reacted with a crosslinking agent to be hereinafter described.

The acrylic resin may be a homopolymer of a monomer selected from acrylic acid, acrylate esters such as alkyl acrylates, acrylamide, acrylonitrile, methacrylic acid, methacrylate esters such as alkyl methacrylates, methacrylamide, and methacrylonitrile, or a copolymer prepared by polymerizing two or more of the monomers. The acrylic resin is preferably a homopolymer of a monomer selected from the acrylate esters such as alkyl acrylates and the methacrylate esters such as alkyl methacrylates, or a copolymer prepared by polymerizing two or more of the monomers. For example, the acrylic resin may be a homopolymer of a monomer selected from acrylate and methacrylate esters having an alkyl group with 1 to 6 carbon atoms, or a copolymer prepared by polymerizing two or more of such monomers. It is preferred that the acrylic resin is mainly composed of the above component, and has a functional group reactable with the crosslinking agent to be hereinafter described. For example, in the case of using a carbodiimide compound as the crosslinking agent, the acrylic resin is preferably a polymer prepared using a monomer having a methylol group, a hydroxyl group, a carboxyl group, or an amino group. In the following description of the binder reactable with the crosslinking agent, the carbodiimide compound is used as the crosslinking agent. In the case of using another crosslinking agent, the binder preferably has a functional group selected depending on the type of the agent.

Examples of the vinyl resins include polyvinyl alcohols, acid-modified polyvinyl alcohols, polyvinyl formals, polyvinyl butyrals, polyvinyl methyl ethers, polyolefins, ethylene/butadiene copolymers, polyvinyl acetates, vinyl chloride/vinyl acetate copolymers, vinyl chloride/(meth)acrylate ester copolymers, and ethylene/vinyl acetate copolymers (preferably ethylene/vinyl acetate/(meth)acrylate ester copolymers). Preferred among them are polyvinyl alcohols, acid-modified polyvinyl alcohols, polyvinyl formals, polyolefins, ethylene/butadiene copolymers, and ethylene/vinyl acetate copolymers (preferably ethylene/vinyl acetate/acrylate ester copolymers). In view of the crosslinking reaction with the carbodiimide compound, when the vinyl resin is the polyvinyl alcohol, acid-modified polyvinyl alcohol, polyvinyl formal, polyvinyl butyral, polyvinyl methyl ether, or polyvinyl acetate, it is preferred that a vinyl alcohol unit is maintained in the polymer to obtain a polymer having a hydroxyl group. When the vinyl resin is another polymer, it is preferred that a monomer having a methylol group, a hydroxyl group, a carboxyl group, or an amino group is partly used to obtain a crosslinkable polymer.

The urethane resin may be a polyurethane derived from a polyisocyanate and one or more compounds selected from polyhydroxy compounds (such as ethylene glycol, propylene glycol, glycerin, and trimethylolpropane), aliphatic polyester polyols prepared by a reaction between a polyhydroxy compound and a polybasic acid, polyether polyols (such as poly(oxypropylene ether)polyols and poly(oxyethylene-propylene ether)polyols), polycarbonate polyols, and polyethylene terephthalate polyols. For example, an unreacted hydroxyl group, remaining in the polyurethane resin after the reaction between the polyol and the polyisocyanate, can be used as a functional group crosslinkable with the carbodiimide compound.

Generally the ester resin may be a polymer prepared by a reaction between a polybasic acid and a polyhydroxy compound (such as ethylene glycol, propylene glycol, glycerin, or trimethylolpropane). For example, an unreacted hydroxyl or carboxyl group, remaining in the ester resin after the reaction between the polyol and the polybasic acid, can be used as a functional group crosslinkable with the carbodiimide compound. Of course a third component having a functional group such as a hydroxyl group may be added thereto.

As described above, the conductive layer 16 is preferably crosslinked. In this case, the conductive layer 16 may be crosslinked using the crosslinking agent, and may be crosslinked without the crosslinking agent using a photochemical reaction induced by light irradiation which does not affect the photosensitivity. Examples of the crosslinking agents include vinylsulfone compounds (such as 1,3-bisvinylsulfonylpropane), aldehyde compounds (such as glyoxal), pyrimidine chloride compounds (such as 2,4,6-trichloropyrimidine), triazine chloride compounds (such as cyanuric chloride), epoxy compounds, and carbodiimide compounds.

Preferred examples of the epoxy compounds include 1,4-bis(2',3'-epoxypropyloxy)butane, 1,3,5-triglycidyl isocyanurate, 1,3-diglycidyl-5-(γ-acetoxy-β-oxypropyl)isocyanurate, sorbitol polyglycidyl ethers, polyglycerol polyglycidyl ethers, pentaerythritol polyglycidyl ethers, diglycerol polyglycidyl ethers, 1,3,5-triglycidyl(2-hydroxyethyl)isocyanurate, glycerol polyglycerol ethers, and trimethylolpropane polyglycidyl ethers. Specific commercially available products thereof include DENACOL EX-521 and EX-614B (available from Nagase ChemteX Corporation). The epoxy compound is not limited to the examples.

The epoxy compound may be used in combination with another crosslinkable compound, as long as the amount of the other crosslinkable compound added has no affect on the photosensitive property. Examples of the other crosslinkable compounds include hardening agents described in C. E. K. Meers and T. H. James, "*The Theory of the Photographic Process*", 3rd edition (1966), U.S. Pat. Nos. 3,316,095, 3,232,764, 3,288,775, 2,732,303, 3,635,718, 3,232,763, 2,732,316, 2,586,168, 3,103,437, 3,017,280, 2,983,611, 2,725,294, 2,725,295, 3,100,704, 3,091,537, 3,321,313, 3,543,292, and 3,125,449, and UK Patent Nos. 994869 and 1167207, etc.

Typical examples of the hardening agents include, though not restrictive, melamine compounds containing two or more (preferably three or more) methylol or alkoxymethyl groups, and condensation polymers thereof such as melamine resins and melamine-urea resins; aldehyde compounds such as mucochloric acid, mucobromic acid, mucophenoxychloric acid, mucophenoxybromic acid, formaldehyde, glyoxal, monomethylglyoxal, 2,3-dihydroxy-1,4-dioxane, 2,3-dihydroxy-5-methyl-1,4-dioxane, succinaldehyde, 2,5-dimethoxytetrahydrofuran, and glutaric aldehyde, and derivatives thereof; active vinyl compounds such as divinylsulfone-N,N'-ethylene-bis(vinylsulfonylacetamide), 1,3-bis(vinylsulfonyl)-2-propanol, methylenebismaleimide, 5-acetyl-1,3-diacryloyl-hexahydro-s-triazine, 1,3,5-triacryloyl-hexahydro-s-triazine, and 1,3,5-trivinylsulfonyl-hexahydro-s-triazine; active halogen compounds such as 2,4-dichloro-6-hydroxy-s-triazine sodium salt, 2,4-dichloro-6-(4-sulfoanilino)-s-triazine sodium salt, 2,4-dichloro-6-(2-sulfoethylamino)-s-triazine, and N,N'-bis(2-chloroethylcarbamyl)piperazine; ethyleneimine compounds such as bis(2,3-epoxypropyl)methylpropylammonium p-toluenesulfonate salt, 2,4,6-triethylene-s-triazine, 1,6-hexamethylene-N,N'-bisethyleneurea, and bis-β-ethyleneiminoethyl thioether; methanesulfonate ester compounds such as 1,2-di(methanesulfonoxy)ethane, 1,4-di(methanesulfonoxy)butane, and 1,5-di(methanesulfonoxy)pentane; carbodiimide compounds such as dicyclohexylcarbodiimide and 1-dicyclohexyl-3-(3-trimethylaminopropyl)carbodiimide hydrochloride salt; isoxazole compounds such as 2,5-dimethylisoxazole; inorganic compounds such as chrome alum and chromium acetate; dehydration-condensation-type peptide reagents such as N-carboethoxy-2-isopropoxy-1,2-dihydroquinoline and N-(1-morpholinocarboxy)-4-methylpyridium chloride; active ester compounds such as N,N'-adipoyldioxydisuccinimide and N,N'-terephthaloyldioxydisuccinimide; isocyanate compounds such as toluene 2,4-diisocyanate and 1,6-hexamethylene diisocyanate; and epichlorohydrin compounds such as polyamide-polyamine-epichlorohydrin reaction products.

The carbodiimide compound preferably has a plurality of carbodiimide structures in the molecule.

Such a polycarbodiimide compound is generally synthesized by a condensation reaction of an organic diisocyanate. The organic moiety of the organic diisocyanate used for synthesizing the carbodiimide compound having a plurality of carbodiimide structures is not particularly limited, and may be an aromatic moiety, an aliphatic moiety, or a combination thereof. It is preferred from the viewpoint of reactivity that the organic moiety is aliphatic.

In the synthesis, an organic isocyanate, an organic diisocyanate, an organic triisocyanate, etc. is used as a starting material. The organic isocyanate may be an aromatic isocyanate, an aliphatic isocyanate, or a mixture thereof.

Specific examples thereof include 4,4'-diphenylmethane diisocyanate, 4,4-diphenyldimethylmethane diisocyanate, 1,4-phenylene diisocyanate, 2,4-tolylene diisocyanate, 2,6-tolylene diisocyanate, hexamethylene diisocyanate, cyclohexane diisocyanate, xylylene diisocyanate, 2,2,4-trimethylhexamethylene diisocyanate, 4,4'-dicyclohexylmethane diisocyanate, and 1,3-phenylene diisocyanate. Examples of the organic monoisocyanates include isophorone isocyanate, phenyl isocyanate, cyclohexyl isocyanate, butyl isocyanate, and naphthyl isocyanate.

Specific examples of commercially available carbodiimide compounds include CARBODILITE V-02-L2 (trade name, available from Nisshinbo Industries, Inc.).

The mass ratio of the carbodiimide compound used as the crosslinking agent to the binder is preferably 1% to 200% by mass, more preferably 5% to 100% by mass.

The conductive layer 16 may be formed by a physical method such as a sputtering method, or a widely known coating method such as a dip coating method, an air knife coating method, a curtain coating method, a wire-bar coating method, a gravure coating method, or an extrusion coating method.

In the formation of the conductive layer 16 using such a method, it is preferred that (A) the amount of the conductive layer 16 is controlled to infill the depression of the wiring pattern such that the surfaces of the thin-wire structure portion 14 and the conductive layer 16 form a flat surface, (B) the conductive layer 16 is ground such that the surfaces of the thin-wire structure portion 14 and the conductive layer 16 form a flat surface, or (C) the thin-wire structure portion 14 is subjected to a surface treatment for preventing a component of the conductive layer 16 from being attached to the thin-wire structure portion 14, and then the conductive layer 16 is formed thereon.

In the case of using the method of (C), because a coating liquid containing the material for the conductive layer 16 generally has high polarity or hydrophilicity, the surface of the thin-wire structure portion 14 preferably has low polarity or hydrophobicity. Specifically, it is preferred that the thin-wire structure portion 14 is surface-treated with a hydrophobic metal-treating agent such as an alkylthiol compound. The treating agent is preferably removed in an aftertreatment.

Additionally a functional layer having a particular function may be formed on the conductive layer 16 if necessary. The functional layer may have various functions according to the purpose. For example, the functional layer may be an antireflection layer having an antireflection function with controlled refraction and thickness, a nonglare or antiglare layer having a glare prevention function, a near-infrared-absorbing layer containing a compound or metal capable of absorbing a near-infrared ray, a color tone-controlling layer capable of absorbing a visible light in a particular wavelength region, an antifouling layer having a function for easily removing an attached stain such as fingermark thereon, a hard coating layer having a scratch resistance, a layer having an impact absorption function, a layer having a glass shatterproof function, etc. The functional layer may be formed on the surface of the conductive layer 16 or the back surface of the support 12.

The method, which contains exposing and developing the photosensitive material having the support 12 and thereon the photosensitive silver salt layer to form the conductive metallic silver portion and the light-transmitting portion, thereby forming the thin-wire structure portion 14, will be described below.

[Emulsion Layer (Photosensitive Silver Salt Layer)]

The photosensitive material for the production method according to this embodiment has the support 12 and thereon an emulsion layer containing a silver salt as a light sensor (the photosensitive silver salt layer). The photosensitive silver salt layer may contain a solvent and an additive such as a dye in addition to a silver salt and a binder.

It is preferred that the emulsion layer is substantially an uppermost layer. The term "the emulsion layer is substantially an uppermost layer" means not only that the emulsion layer is formed at the top, but also that a layer formed on the emulsion layer (i.e. a protective layer) has a total thickness of 0.5 μm or less. The layer formed on the emulsion layer preferably has a total thickness of 0.2 μm or less.

Each component in the emulsion layer will be described below.

<Dye>

The photosensitive material may contain a dye in at least the emulsion layer. The dye is contained in the emulsion layer as a filter dye or for a purpose of irradiation prevention, etc. The dye may be a solid dispersion dye. Preferred examples of the dyes useful in the present invention include dyes represented by the general formulae (FA), (FA1), (FA2), and (FA3) of Japanese Laid-Open Patent Publication No. 9-179243, specifically the compounds F1 to F34 of this patent publication. The preferred examples further include (II-2) to (II-24), (III-5) to (III-18), and (IV-2) to (IV-7) described in Japanese Laid-Open Patent Publication No. 7-152112.

The dye used in this embodiment may be such as decolored in the solid fine particle dispersion state in a development or fixation treatment. Examples of such dyes include cyanine dyes, pyrylium dyes, and aminium dyes described in Japanese Laid-Open Patent Publication No. 3-138640. Examples of dyes not decolored in the treatment include cyanine dyes having a carboxyl group described in Japanese Laid-Open Patent Publication No. 9-96891; cyanine dyes having no acidic groups described in Japanese Laid-Open Patent Publication No. 8-245902; lake cyanine dyes described in Japanese Laid-Open Patent Publication No. 8-333519; cyanine dyes described in Japanese Laid-Open Patent Publication No. 1-266536; holopolar cyanine dyes described in Japanese Laid-Open Patent Publication No. 3-136038; pyrylium dyes described in Japanese Laid-Open Patent Publication No. 62-299959; polymer cyanine dyes described in Japanese Laid-Open Patent Publication No. 7-253639; solid fine particle dispersions of oxonol dyes described in Japanese Laid-Open Patent Publication No. 2-282244; light scattering particles described in Japanese Laid-Open Patent Publication No. 63-131135; $Yb^{3+}$ compounds described in Japanese Laid-Open Patent Publication No. 9-5913; and ITO powders described in Japanese Laid-Open Patent Publication No. 7-113072. Further, dyes represented by the general formulae (F1) and (F2) of Japanese Laid-Open Patent Publication No. 9-179243, specifically the compounds F35 to F112, may be used in the present invention.

The above dye may be a water-soluble dye, and examples thereof include oxonol dyes, benzylidene dyes, merocyanine dyes, cyanine dyes, and azo dyes. Among them, oxonol dyes, hemioxonol dyes, and benzylidene dyes are effective in the present invention. Specific examples of the water-soluble dyes useful in the present invention include dyes described in UK Patent Nos. 584,609 and 1,177,429; Japanese Laid-Open Patent Publication Nos. 48-85130, 49-99620, 49-114420, 52-20822, 59-154439, and 59-208548; and U.S. Pat. Nos. 2,274,782, 2,533,472, 2,956,879, 3,148,187, 3,177,078, 3,247,127, 3,540,887, 3,575,704, 3,653,905, and 3,718,427.

The mass ratio of the dye to the total solid contents in the emulsion layer is preferably 0.01% to 10% by mass, more preferably 0.1% to 5% by mass, in view of the effects such as the irradiation prevention effect and the sensitivity reduction due to the excess addition.

<Silver Salt>

The silver salt used in the embodiment may be an inorganic silver salt such as a silver halide or an organic silver salt such as silver acetate. In this embodiment, the silver halide excellent in light sensing property is preferably used as the silver salt.

The silver halide, preferably used in this embodiment, will be described below.

In this embodiment, the silver halide excellent in light sensing property is preferably used as the silver salt. Technologies for photographic silver salt films, photographic papers, print engraving films, emulsion masks for photomasking, and the like, using the silver halide, may be utilized in the present invention.

The silver halide may contain a halogen element of chlorine, bromine, iodine, or fluorine, and may contain a combination of the elements. The silver halide preferably contains silver chloride, silver bromide, or silver iodide, more preferably contains silver chloride or silver bromide, as a main component. Also silver chlorobromide, silver iodochlorobromide, and silver iodobromide can be preferably used as the silver halide. The silver halide is further preferably silver chlorobromide, silver bromide, silver iodochlorobromide, or silver iodobromide, most preferably silver chlorobromide or silver iodochlorobromide having a silver chloride content of 50 mol % or more or a silver halide having a silver bromide content of 50 mol % or more.

The term "the silver halide contains silver bromide as a main component" means that the mole ratio of bromide ion is 50% or more in the silver halide composition. The silver halide containing silver bromide as a main component may contain an iodide or chloride ion in addition to the bromide ion.

The silver iodide content of the silver halide emulsion is preferably at most 1.5 mol % per 1 mol of the silver halide. When the silver iodide content is 1.5 mol % or less, fogging can be reduced and pressure capability can be improved. The silver iodide content is more preferably 1 mol % or less per 1 mol of the silver halide.

The silver halide is in the state of solid particles. The average particle size of the silver halide particles is preferably 0.1 to 1000 nm (1 μm) in spherical equivalent diameter in view of the image quality of the patterned metallic silver layer formed after the exposure and development treatments. The lower limit is more preferably 1 nm, further preferably 10 nm. The upper limit is more preferably 800 nm, further preferably 500 nm, still further preferably 100 nm, particularly 50 nm.

The spherical equivalent diameter of the silver halide particle means a diameter of a spherical particle having the same volume as the silver halide particle.

The shape of the silver halide particle is not particularly limited, and may be a spherical shape, a cubic shape, a tabular shape (such as a tabular hexagonal shape, a tabular triangular shape, or a tabular quadrangular shape), an octahedron shape, a tetradecahedron shape, etc. The silver halide particle preferably has a cubic shape or a tetradecahedron shape.

The inside and the surface of the silver halide particle may comprise the same or different phases. Further, the silver halide particle may have a localized layer having a different halogen composition inside or on the surface.

The silver halide emulsion, used as a coating liquid for the emulsion layer in this embodiment, may be prepared by a method described in P. Glafkides, "*Chimie et Physique Photographique*", Paul Montel, 1967, G. F. Dufin, "Photographic Emulsion Chemistry", The Forcal Press, 1966, V. L. Zelikman, et al., "*Making and Coating Photographic Emulsion*", The Forcal Press, 1964, etc.

Thus, the silver halide emulsion may be prepared by an acidic process or a neutral process. A soluble silver salt and a soluble halogen salt may be reacted by using a one-side mixing process, a simultaneous mixing process, or a combination thereof.

The silver particles may be formed in the presence of excess silver ions by a so-called reverse mixing process. The formation may be achieved by using a so-called controlled double jet method, one of the simultaneous mixing processes containing maintaining a constant pAg in a liquid phase for producing the silver halide.

It is also preferred that the silver particles are formed using a so-called silver halide solvent such as ammonia, a thioether, or a tetrasubstituted thiourea. The solvent is more preferably a tetrasubstituted thiourea compound described in Japanese Laid-Open Patent Publication Nos. 53-82408 and 55-77737. Preferred thiourea compounds include tetramethylthiourea and 1,3-dimethyl-2-imidazolidinethione. The amount of the silver halide solvent is preferably $10^{-5}$ to $10^{-2}$ mol per 1 mol of the silver halide, though the amount may be changed depending on the types of compounds used, the desired particle size, and the desired halogen composition.

The controlled double jet method and the particle forming method using the silver halide solvent are preferred in the present invention because a silver halide emulsion having a regular crystal shape and a narrow particle size distribution can be easily prepared by using the methods.

It is preferred that the silver particles are rapidly grown within a range of the critical saturation degree to obtain a uniform particle size by using a method of changing the addition rate of silver nitrate or an alkali halide according to particle growth rate as described in UK Patent No. 1,535,016, and Japanese Patent Publication Nos. 48-36890 and 52-16364, or a method of changing the concentration of the aqueous solution as described in UK Patent No. 4,242,445 and Japanese Laid-Open Patent Publication No. 55-158124.

The silver halide emulsion used for forming the emulsion layer in this embodiment is preferably a monodisperse emulsion, and the variation coefficient thereof, obtained by {(Standard deviation of particle size)/(Average particle size)}×100, is preferably 20% or less more preferably 15% or less, most preferably 10% or less.

The silver halide emulsion used in this embodiment may be a mixture of a plurality of emulsions having different particle sizes.

The silver halide emulsion used in the embodiment may contain a metal of Group VIII or VIIB. It is particularly preferred that the silver halide emulsion contains a rhodium compound, an iridium compound, a ruthenium compound, an iron compound, an osmium compound, or the like to achieve high contrast and low fogging. Those compounds may have various ligands, and examples of the ligands include cyanide ions, halogen ions, thiocyanate ions, nitrosyl ions, water, hydroxide ions, pseudohalogens, ammonia, and organic molecules such as amines (methylamine, ethylenediamine, etc.), heterocyclic compounds (imidazole, thiazole, 5-methylthiazole, mercaptoimidazole, etc.), ureas, and thioureas.

The silver halide emulsion may be effectively doped with a hexacyano-metal complex such as $K_4[Fe(CN)_6]$, $K_4[Ru(CN)_6]$, or $K_3[Cr(CN)_6]$ for increasing sensitivity.

The rhodium compound may be a water-soluble rhodium compound. Examples of the water-soluble rhodium compounds include halogenated rhodium (III) compounds, hexachloro-rhodium (III) complex salts, pentachloro-aquo-rhodium complex salts, tetrachloro-diaquo-rhodium complex salts, hexabromo-rhodium (III) complex salts, hexamine-rhodium (III) complex salts, trioxalato rhodium (III) complex salts, and $K_3Rh_2Br_9$.

The rhodium compound is used in the state of a solution of water or an appropriate solvent. The rhodium compound solution may be stabilized by a common method of adding an aqueous hydrogen halide solution (such as hydrochloric acid, hydrobromic acid, or hydrofluoric acid) or an alkali halide (such as KCl, NaCl, KBr, or NaBr). Instead of using the water-soluble rhodium compound, another silver halide particles, which are doped with rhodium beforehand, may be added to and dissolved in the mixture for preparing the silver halide.

Examples of the iridium compounds include hexachloro-iridium complex salts such as $K_2IrCl_6$ and $K_3IrCl_6$, hexabromo-iridium complex salts, hexamine-iridium complex salts, and pentachloro-nitrosyl-iridium complex salts.

Examples of the ruthenium compounds include hexachlororuthenium, pentachloronitrosylruthenium, and $K_4[Ru(CN)_6]$.

Examples of the iron compounds include potassium hexacyanoferrate (II) and ferrous thiocyanate.

The above mentioned ruthenium and osmium are added in the state of a water-soluble complex salt described in Japanese Laid-Open Patent Publication Nos. 63-2042, 1-285941, 2-20852, and 2-20855, etc. The water-soluble complex salt is particularly preferably a six-coordinate complex represented by the formula $[ML_6]^{-n}$.

In the formula, M represents Ru or Os, n represents 0, 1, 2, 3, or 4.

The counter ion is not important, and may be an ammonium or alkali metal ion. Preferred ligands include halide ligands, cyanide ligands, cyanoxide ligands, nitrosyl ligands, and thionitrosyl ligands. Specific examples of such complexes used in the present invention are illustrated below without intention of restricting the scope of the invention.

$[RuCl_6]^{-3}$, $[RuCl_4(H_2O)_2]^{-1}$, $[RuCl_5(NO)]^{-2}$, $[RuBr_5(NS)]^{-2}$, $[Ru(CO)_3Cl_3]^{-2}$, $[Ru(CO)Cl_5]^{-2}$, $[Ru(CO)Br_5]^{-2}$, $[OsCl_6]^{-3}$, $[OsCl_5(NO)]^{-2}$, $[Os(NO)(CN)_5]^{-2}$, $[Os(NS)Br_5]^{-2}$, $[Os(CN)_6]^{-4}$, $[Os(O)_2(CN)_5]^{-4}$.

The amount of the compound added per 1 mol of the silver halide is preferably $10^{-10}$ to $10^{-2}$ mol/mol Ag, more preferably $10^{-9}$ to $10^{-3}$ mol/mol Ag.

Further, in this embodiment, the silver halide may preferably contain Pd (II) ion and/or Pd metal. Pd is preferably contained in the vicinity of the surface of the silver halide particle though it may be uniformly distributed in the silver halide particle. The term "Pd is contained in the vicinity of the surface of the silver halide particle" means that the silver halide particle has a higher palladium content in a region of 50 nm or less in the depth direction from the surface, compared to the other part of the particle.

Such silver halide particles can be prepared by adding Pd during the particle formation. Pd is preferably added after the silver ion and halogen ion are added by 50% or more of the total amounts respectively. Further, it is also preferred that the Pd (II) ion is added in an after-ripening process to obtain the silver halide particle containing Pd near the surface.

The Pd-containing silver halide particle acts to accelerate the physical development or electroless plating, improve production efficiency of a desired electromagnetic wave-shielding material, and lower the production cost. Pd is well known and used as an electroless plating catalyst. In the present invention, Pd can be located in the vicinity of the surface of the silver halide particle, so that the remarkably expensive Pd can be saved.

In this embodiment, the content of the Pd ion and/or Pd metal per 1 mol of silver in the silver halide is preferably $10^{-4}$ to 0.5 mol/mol Ag, more preferably 0.01 to 0.3 mol/mol Ag.

Examples of Pd compounds useful for the silver halide include $PdCl_4$ and $Na_2PdCl_4$.

As with common photographic photosensitive silver halide materials, the silver halide emulsion according to this embodiment may be subjected to chemical sensitization. In the chemical sensitization, a chemical sensitizer of a chalcogenite compound or a noble metal compound having an effect for sensitizing the photosensitive material is added to the silver halide emulsion as cited in Japanese Laid-Open Patent Publication No. 2000-275770, paragraph [0078] or later. It is preferred that the silver salt emulsion for the photosensitive material of this embodiment is not chemically sensitized, and thus is a chemically unsensitized emulsion. In the preparation of the chemically unsensitized emulsion according to the embodiment, the amount of the chemical sensitizer of the chalcogenite compound or the noble metal compound is preferably controlled within a range that the sensitivity is increased only by 0.1 or less by the addition of the chemical sensitizer. In the preparation of the chemically unsensitized emulsion according to the embodiment, the total amount of the chemical sensitizer of the chalcogenite compound or the noble metal compound is not specifically limited, and is preferably $5 \times 10^{-7}$ mol or less per 1 mol of the silver halide.

In this embodiment, the sensitivity as the light sensor may be increased by the chemical sensitization, which is generally used for photographic emulsions. Examples of the chemical sensitization methods include chalcogen sensitization methods (such as sulfur sensitization methods, selenium sensitization methods, and tellurium sensitization methods), noble metal sensitization methods (such as gold sensitization methods), and reduction sensitization methods. The methods may be used singly or in combination. Preferred combinations of the chemical sensitization methods include combinations of a sulfur sensitization method and a gold sensitization method, combinations of a sulfur sensitization method, a selenium sensitization method, and a gold sensitization method, and combinations of a sulfur sensitization method, a tellurium sensitization method, and a gold sensitization method.

The sulfur sensitization is generally carried out such that a sulfur sensitizer is added to the emulsion, and the emulsion is stirred at a high temperature of 40° C. or higher for a predetermined time. The sulfur sensitizer may be a known compound, and examples thereof include sulfur compounds contained in gelatin, and further various sulfur compounds such as thiosulfate salts, thiourea compounds, thiazole compounds, and rhodanine compounds. The sulfur compound is preferably a thiosulfate salt or a thiourea compound. The amount of the sulfur sensitizer added per 1 mol of the silver halide is preferably $10^{-7}$ to $10^{-2}$ mol, more preferably $10^{-5}$ to $10^{-3}$ mol, though the amount may be changed depending on various conditions such as pH, temperature, and silver halide particle size in a chemical ripening process.

A selenium sensitizer is used in the selenium sensitization, and it may be a known selenium compound. The selenium sensitization is generally carried out such that an unstable selenium compound and/or a non-unstable selenium compound are added to the emulsion, and the emulsion is stirred at a high temperature of 40° C. or higher for a predetermined time. Examples of the unstable selenium compounds include those described in Japanese Patent Publication Nos. 44-15748 and 43-13489, Japanese Laid-Open Patent Publication Nos. 4-109240 and 4-324855. In particular, a compound represented by the general formula (VIII) or (IX) of Japanese Laid-Open Patent Publication No. 4-324855 is preferably used as the unstable selenium compound.

A tellurium sensitizer is used in the tellurium sensitization for generating silver telluride on or inside the silver halide particle. The silver telluride is estimated to act as a sensitization nucleus. The rate of the silver telluride generation in the silver halide emulsion can be examined by a method described in Japanese Laid-Open Patent Publication No. 5-313284. Specific examples of the tellurium sensitizers include compounds described in U.S. Pat. Nos. 1,623,499, 3,320,069, and 3,772,031; UK Patent Nos. 235,211, 1,121, 496, 1,295,462, and 1,396,696; Canadian Patent No. 800, 958; Japanese Laid-Open Patent Publication Nos. 4-204640, 4-271341, 4-333043, and 5-303157; *J. Chem. Soc., Chem. Commun.*, 635 (1980); ibid, 1102 (1979); ibid, 645 (1979); *J. Chem. Soc., Perkin. Trans.* 1, 2191 (1980); S. Patai, *"The Chemistry of Organic Selenium and Tellurium Compounds"*, Vol. 1 (1986); and ibid, Vol. 2 (1987). Particularly preferred are compounds represented by the general formulae (II), (III), and (IV) of Japanese Laid-Open Patent Publication No. 5-313284.

In this embodiment, the amount of the selenium or tellurium sensitizer used per 1 mol of the silver halide is generally about $10^{-8}$ to $10^{-2}$ mol, preferably about $10^{-7}$ to $10^{-3}$ mol, though the amount may be changed depending on the silver halide particles used, the chemical ripening conditions, etc. The chemical sensitization in the present invention is carried out under conditions of a pH of 5 to 8, a pAg of 6 to 11, preferably 7 to 10, and a temperature of 40° C. to 95° C., preferably 45° C. to 85° C., though not particularly restrictive.

The noble metal sensitization may be gold sensitization, platinum sensitization, palladium sensitization, iridium sensitization, or the like, and the gold sensitization is particularly preferred. A gold sensitizer is used in the gold sensitization, and specific examples thereof include chlorauric acid, potassium chloroaurate, potassium aurithiocyanate, gold sulfide, gold (I) thioglucose, and gold (I) thiomannose. The amount of the gold sensitizer per 1 mol of the silver halide may be about $10^{-7}$ to $10^{-2}$ mol. A cadmium salt, a sulfite salt, a lead salt, a thallium salt, or the like may be contained in the silver halide emulsion during the silver halide particle formation or physical ripening process.

The reduction sensitization may be carried out in this embodiment. Examples of reduction sensitizers include stannous salts, amines, formamidinesulfinic acid, and silane compounds. A thiosulfonic acid compound may be added to the silver halide emulsion by a method described in EP-A-293917. In the present invention, only one silver halide emulsion may be used for producing the photosensitive material, or alternatively a plurality of silver halide emulsions may be used in combination therefor. For example, emulsions different in average particle size, halogen composition, crystal habit, chemical sensitization condition, or sensitivity may be used in combination. It is preferred in view of increasing the contrast that an emulsion with a higher sensitivity is applied to a region closer to the support as described in Japanese Laid-Open Patent Publication No. 6-324426.

<Water-Soluble Binder>

A binder may be used in the emulsion layer to uniformly disperse the silver salt particles and to help the emulsion layer adhere to the support. In this embodiment, the binder is a water-soluble binder that can be removed by dipping in a hot water or bringing in contact with a water vapor as described hereinafter. The water-soluble binder is preferably a water-soluble polymer.

Examples of the binders include gelatins, carrageenans, polyvinyl alcohols (PVA), polyvinyl pyrolidones (PVP), polysaccharides such as starches, celluloses and derivatives thereof, polyethylene oxides, polysaccharides, polyvinylamines, chitosans, polylysines, polyacrylic acids, polyalginic acids, polyhyaluronic acids, carboxycelluloses, gum arabics, and sodium alginate. These binders show a neutral, anionic, or cationic property due to ionicity of a functional group.

The gelatin binder may be a lime-treated gelatin or an acid-treated gelatin, and may be a hydrolyzed gelatin, an enzymatically decomposed gelatin, or a gelatin having a modified amino or carboxyl group (such as a phthalated gelatin or an acetylated gelatin).

The amount of the binder in the emulsion layer is not particularly limited, and may be appropriately selected to achieve the dispersion and adhesion properties. The volume ratio of Ag/binder in the emulsion layer is preferably 1/4 or more, more preferably 1/1 or more.

<Solvent>

The solvent for forming the emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

In this embodiment, the mass ratio of the solvent used in the emulsion layer according to this embodiment, to the total of the silver salt, the binder, and the like in the emulsion layer is 30% to 90% by mass, preferably 50% to 80% by mass.

<Antistatic Agent>

The photosensitive material according to this embodiment preferably contains an antistatic agent. It is desirable that a support surface on the opposite side of the emulsion layer is coated with the antistatic agent.

A layer containing a conductive substance, which has a surface resistivity of $10^{12}$ $\Omega$/sq or less in the atmosphere of 25° C. and 25% RH, can be preferably used as an antistatic layer. Preferred examples of the antistatic agents include the following conductive substances.

For example, the antistatic agent may be a conductive substance described in Japanese Laid-Open Patent Publication No. 2-18542, from page 2, lower left column, line 13, to page 3, upper right column, line 7. Specific examples of the antistatic agents include metal oxides described in this patent publication, page 2, lower right column, lines 2 to 10; conductive high-molecular compounds P-1 to P-7 described in this patent publication; and needle-like metal oxides described in U.S. Pat. No. 5,575,957, Japanese Laid-Open Patent Publication No. 10-142738, paragraphs [0043] to [0045], Japanese Laid-Open Patent Publication No. 11-223901, paragraphs [0013] to [0019].

Conductive metal oxide particles used in this embodiment may contain ZnO, $TiO_2$, $SnO_2$, $Al_2O_3$, $In_2O_3$, MgO, BaO, $MoO_3$, or a composite oxide thereof, and may further contain a dissimilar atom. The metal oxide is preferably $SnO_2$, ZnO, $Al_2O_3$, $TiO_2$, $In_2O_3$, or MgO, more preferably $SnO_2$, ZnO, $In_2O_3$, or $TiO_2$, particularly preferably $SnO_2$. In the case of using a small amount of the dissimilar atom, for example, the particle may be composed of ZnO doped with Al or In, $TiO_2$ doped with Nb or Ta, $In_2O_3$ doped with Sn, or $SnO_2$ doped with Sb, Nb, or a halogen. The amount of the dissimilar atom may be 0.01 to 30 mol %, preferably 0.1 to 10 mol %. When the amount of the dissimilar atom is less than 0.01 mol %, the atom can hardly function to sufficiently increase the conductivity of the oxide or composite oxide. When the amount is more than 30 mol %, the blackness of the particle is increased, and the antistatic layer is disadvantageously blackened. In this embodiment, it is preferred that the conductive metal oxide particle contains the metal oxide or composite metal oxide and a small amount of the dissimilar atom. Also it is preferred that the particle has an oxygen defect in the crystal structure.

The fine conductive metal oxide particle containing a small amount of the dissimilar atom is preferably an $SnO_2$ particle doped with antimony, particularly an $SnO_2$ particle doped with 0.2 to 2.0 mol % of antimony.

The shape of the conductive metal oxide particle used in this embodiment is not particularly limited, and may be a granular or needle-like shape, etc. The average particle size of the particle is 0.5 to 25 μm in spherical equivalent diameter.

A soluble salt (such as a chloride or a nitrate), a vapor-deposited metal layer, an ionic polymer described in U.S. Pat. Nos. 2,861,056 and 3,206,312, an insoluble inorganic salt described in U.S. Pat. No. 3,428,451, etc. may be used to improve the conductivity.

The antistatic layer containing such a conductive metal oxide particle is preferably formed as an undercoat layer for the back surface or the emulsion layer, etc. The amount of the antistatic layer is preferably 0.01 to 1.0 $g/m^2$ in the total of both sides.

The photosensitive material preferably has a volume resistivity of $1.0 \times 10^7$ to $1.0 \times 10^{12}$ Ω·cm under the atmosphere of 25° C. and 25% RH.

In this embodiment, the above conductive substance may be used in combination with a fluorine-containing surfactant, described in Japanese Laid-Open Patent Publication No. 2-18542, from page 4, upper right column, line 2, to page 4, lower right column, the third line from the bottom, or Japanese Laid-Open Patent Publication No. 3-39948, from page 12, lower left column, line 6, to page 13, lower right column, line 5, to further improve the antistatic property.

<Other Additives>

Various additives can be used in the photosensitive material according to the present invention with no particular restrictions. Preferred examples of the additives include the following ones described in patent publications and the like. In this embodiment, it is desirable not to use a film hardening agent. In the case of using the film hardening agent, resistance increase and conductivity deterioration are caused in the treatment of dipping in a hot water or bringing in contact with a water vapor.

(1) Nucleation Accelerator

Nucleation accelerators include compounds represented by the general formula (I), (II), (III), (IV), (V), or (VI) of Japanese Laid-Open Patent Publication No. 6-82943, compounds represented by the general formula (II-m) to (II-p) and example compounds II-1 to II-22 of Japanese Laid-Open Patent Publication No. 2-103536, from page 9, upper right column, line 13, to page 16, upper left column, line 10, and compounds described in Japanese Laid-Open Patent Publication No. 1-179939.

(2) Spectral Sensitizing Dye

Spectral sensitizing dyes include those described in Japanese Laid-Open Patent Publication No. 2-12236, from page 8, lower left column, line 13, to page 8, lower right column, line 4, Japanese Laid-Open Patent Publication No. 2-103536, from page 16, lower right column, line 3, to page 17, lower left column, line 20, and Japanese Laid-Open Patent Publication Nos. 1-112235, 2-124560, 3-7928, and 5-11389.

(3) Surfactant

Surfactants include those described in Japanese Laid-Open Patent Publication No. 2-12236, from page 9, upper right column, line 7, to page 9, lower right column, line 7, and Japanese Laid-Open Patent Publication No. 2-18542, from page 2, lower left column, line 13, to page 4, lower right column, line 18.

(4) Antifoggant

Antifoggants include thiosulfinic acid compounds described in Japanese Laid-Open Patent Publication No. 2-103536, from page 17, lower right column, line 19, to page 18, upper right column, line 4, and page 18, lower right column, lines 1 to 5, and Japanese Laid-Open Patent Publication No. 1-237538.

(5) Polymer Latex

Polymer latexes include those described in Japanese Laid-Open Patent Publication No. 2-103536, page 18, lower left column, lines 12 to 20.

(6) Compound Having Acid Group

Compounds having an acid group include those described in Japanese Laid-Open Patent Publication No. 2-103536, from page 18, lower right column, line 6, to page 19, upper left column, line 1.

(7) Film Hardening Agent

Film hardening agents include compounds described in Japanese Laid-Open Patent Publication No. 2-103536, page 18, upper right column, lines 5 to 17.

(8) Black Pepper Inhibitor

A black pepper inhibitor may be used to inhibit generation of developed silver dots in an unexposed area, and examples thereof include compounds described in U.S. Pat. No. 4,956,257 and Japanese Laid-Open Patent Publication No. 1-118832.

(9) Redox Compound

Redox compounds include compounds represented by the general formula (I) (particularly example compounds 1 to 50) of Japanese Laid-Open Patent Publication No. 2-301743, compounds represented by the general formula (R-1), (R-2), or (R-3) and example compounds 1 to 75 described in Japanese Laid-Open Patent Publication No. 3-174143, pages 3 to 20, and compounds described in Japanese Laid-Open Patent Publication Nos. 5-257239 and 4-278939.

(10) Monomethine Compound

Monomethine compounds include compounds represented by the general formula (II) (particularly example compounds II-1 to II-26) of Japanese Laid-Open Patent Publication No. 2-287532.

(11) Dihydroxybenzene Compound

Dihydroxybenzene compounds include compounds described in Japanese Laid-Open Patent Publication No. 3-39948, from page 11, upper left column, to page 12, lower left column, and European Patent Application Publication No. 452772A.

[Other Layers]

A protective layer may be formed on the emulsion layer. The protective layer used in this embodiment comprises a binder such as a gelatin or high-molecular polymer, and is formed on the photosensitive emulsion layer to improve the scratch prevention or mechanical property. The thickness of the protective layer is preferably 0.2 μm or less. The method of applying or forming the protective layer is not particularly limited, and may be appropriately selected from known coating methods.

(Method for Forming Thin-wire Structure Portion)

A method for forming the thin-wire structure portion using the above photosensitive material will be described below. In the transparent conductive film 10 according to this embodiment, the thin-wire structure portion 14 may be formed on the support 12 by pattern exposure, or alternatively a metal may be formed by surface exposure. In the case of using the transparent conductive film 10 as a printed wiring board, a metallic silver portion and an insulating portion may be formed.

In this embodiment, specific examples of methods for forming the thin-wire structure portion 14 include the following three processes, different in the photosensitive materials and development treatments.

(1) A process comprising subjecting a photosensitive black-and-white silver halide material free of physical development nuclei to a chemical or thermal development, to form the metallic silver portion on the material.

(2) A process comprising subjecting a photosensitive black-and-white silver halide material having a silver halide emulsion layer containing a physical development nucleus to a solution physical development, to form the metallic silver portion on the material.

(3) A process comprising subjecting a stack of a photosensitive black-and-white silver halide material free of physical development nuclei and an image-receiving sheet having a non-photosensitive layer containing a physical development nucleus to a diffusion transfer development, to form the metallic silver portion on the non-photosensitive, image-receiving sheet.

The process of (1) is an integral black-and-white development-type method capable of forming a light-transmitting conductive layer on the photosensitive material. The resulting developed silver is a chemically or thermally developed silver comprising a high-specific surface area filament, and shows a high activity in the following plating treatment or physical development.

In the process of (2), silver halide particles are melted around the physical development nucleus and deposited on the nucleus in an exposed area, to form a light-transmitting conductive layer for a light-transmitting electromagnetic-shielding film, a light-transmitting conductive film, or the like, on the photosensitive material. Also the process of (2) is an integral black-and-white development-type method. Though high activity can be achieved since the silver halide is deposited on the physical development nucleus in the development, the developed silver has a spherical shape with small specific surface.

In the process of (3), silver halide particles are melted in an unexposed area, and diffused and deposited on the development nucleus of the image-receiving sheet, to form a light-transmitting conductive layer for a light-transmitting electromagnetic-shielding film, a light-transmitting conductive film, or the like, on the sheet. The process of (3) is a so-called separate-type method, and the image-receiving sheet is peeled off from the photosensitive material.

A negative development treatment or a reversal development treatment can be used in these processes. In a diffusion transfer development, the negative development treatment can be carried out using an auto-positive photosensitive material. The negative development treatment is preferably used in this embodiment.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd. and C. E. K. Mees, "*The Theory of Photographic Process, 4th ed.*", Mcmillan, 1977. Furthermore, for example, techniques described in Japanese Laid-Open Patent Publication Nos. 2004-184693, 2004-334077, and 2005-010752, and Japanese Patent Application Nos. 2004-244080 and 2004-085655 may be used.

[Exposure]

In the production method according to this embodiment, the photosensitive silver salt layer formed on the support 12 is exposed. The layer may be exposed using an electromagnetic wave. For example, the electromagnetic wave may comprise a light such as a visible light or an ultraviolet light, or a radiation ray such as an X-ray. The exposure may be carried out using a light source having a wavelength distribution or a specific wavelength.

The photosensitive layer may be subjected to scanning exposure using a cathode-ray tube (CRT) as the light source. As compared with laser exposure apparatus, the cathode-ray tube exposure apparatus is simpler, more compact, and lower-cost. Further, the light axis and the light color of the cathode-ray tube exposure apparatus can be controlled more easily. In the cathode-ray tube for the image exposure, an illuminant capable of emitting a light in a spectral region may be selected depending on the intended use. For example, red illuminants, green illuminants, and blue illuminants may be used singly or in combination as the light source. The spectral region is not limited to the red, green, and blue regions, and may be the yellow, orange, purple, or infrared region. Particularly a white light-emitting cathode-ray tube, obtained by combining the illuminants, is often used as the light source. Further, an ultraviolet lamp is preferred, and a mercury lamp emitting a g- or i-ray may be used, as the light source.

In the production method according to this embodiment, various laser beams may be used in the exposure. For example, in the exposure in the present invention, a monochromatic high-density light of a gas laser, a light-emitting diode, a semiconductor laser, or a second harmonic generation (SHG) light source containing a nonlinear optical crystal in combination with a semiconductor laser or a solid laser using a semiconductor laser as an excitation source, etc. is preferably used for the scanning exposure. Further, a KrF excimer laser, an ArF excimer laser, an F2 laser, or the like may be used in the exposure. It is preferred that the exposure is carried out using the semiconductor laser or the second harmonic generation (SHG) light source containing the non-linear optical crystal in combination with the semiconductor laser or the solid laser to reduce the size and costs of the system. It is particularly preferred that the exposure is carried out using the semiconductor laser from the viewpoints of reducing the size and costs of the apparatus and improving the durability and stability of the apparatus.

Preferred specific examples of the laser light sources include a blue semiconductor laser having a wavelength of 430 to 460 nm (announced by Nichia Corporation in The 48th Meeting of The Japan Society of Applied Physics and Related Societies in March 2001); a green laser having a wavelength of about 530 nm, converted from a semiconductor laser having an oscillation wavelength of about 1060 nm by an SHG $LiNbO_3$ crystal having a waveguide-shaped reverse domain structure; a red semiconductor laser having a wavelength of about 685 nm (Hitachi Type No. HL6738MG); and a red semiconductor laser having a wavelength of about 650 nm (Hitachi Type No. HL6501MG).

The exposure of the silver salt layer in a pattern may be carried out using a surface exposure method using a photomask or a scanning exposure method using a laser beam. In the methods, a refraction exposure process using a lens or a reflection exposure process using a reflecting mirror may be used, and various exposure treatments such as contact exposure, proximity exposure, reduced projection exposure, and reflecting projection exposure treatments may be carried out.

In the production method according to this embodiment, the silver salt layer is subjected to a development treatment after the exposure. Common development technologies for photographic silver salt films, photographic papers, print engraving films, emulsion masks for photomasking, etc. may be used in the development treatment. A developer for the development treatment is not particularly limited, and may be a PQ developer, an MQ developer, an MAA developer, etc.

Examples of commercially available developers usable in this embodiment include CN-16, CR-56, CP45X, FD-3, ND-1, FT-803R, HS-1, HS-5, PAPITOL, COPINAL, FINEDOL, and MICROFINE (trade names) available from FUJIFILM Corporation; C-41, E-6, RA-4, Dsd-19, and D-72 (trade names) available from Eastman Kodak Company; and developers contained in kits thereof. The developer may be a lith developer such as D85 (trade name) available from Eastman Kodak Company.

In the method for producing the transparent conductive film according to this embodiment, by the exposure and development treatments, the patterned metallic silver portion is formed in the exposed area, and the light-transmitting portion to be hereinafter described is formed in the unexposed area. In this embodiment, the development, the fixation, and the water washing are preferably carried out at a temperature of 35° C. or lower.

In the production method according to this embodiment, the development process may contain a fixation treatment for removing the silver salt in the unexposed area to stabilize the material. The fixation treatment may be carried out using common fixation technologies for photographic silver salt films, photographic papers, print engraving films, emulsion masks for photomasking, etc.

The developer for the development treatment may contain an image quality improver for improving the image quality. Examples of the image quality improvers include nitrogen-containing heterocyclic compounds such as benzotriazole. In the case of using the lith developer, a polyethylene glycol is particularly preferably used.

The ratio of the mass of the metallic silver contained in the exposed area after the development to the mass of the silver contained in this area before the exposure is preferably 50% by mass or more, more preferably 80% by mass or more. When the ratio is 50% by mass or more, a high conductivity can be easily achieved.

In this embodiment, a tone obtained by the development is preferably more than 4.0, though not particularly restrictive. When the tone after the development is more than 4.0, the conductivity of the conductive metal portion can be increased while maintaining high transparency of the light-transmitting portion. For example, the tone of 4.0 or more can be achieved by the above mentioned doping with rhodium or iridium ion.

[Oxidation Treatment]

In the production method according to this embodiment, the metallic silver portion formed by the development treatment is preferably subjected to an oxidation treatment. For example, a small amount of a metal deposited on the light-transmitting portion can be removed by the oxidation treatment, so that the transmittance of the light-transmitting portion can be increased to approximately 100%.

The oxidation treatment may be carried out by a known method using an oxidant such as Fe (III) ion. The oxidation treatment may be carried out after the exposure and development treatments of the silver salt layer.

In this embodiment, the metallic silver portion may be treated with a Pd-containing solution after the exposure and development treatments. The Pd may be in the state of divalent palladium ion or metal palladium. A black color of the metallic silver portion can be prevented from changing with time by this treatment.

[Reduction Treatment]

A desirable film with high conductivity can be obtained by dipping the photosensitive material in an aqueous reducing solution after the development treatment.

The aqueous reducing solution may be an aqueous solution of sodium sulfite, hydroquinone, p-phenylenediamine, oxalic acid, etc. The aqueous solution preferably has a pH of 10 or more.

[Compression Treatment]

In the production method according to this embodiment, the thin-wire structure portion 14 is preferably subjected to a compression (smoothing) treatment after the development treatment. The conductivity of the thin-wire structure portion 14 can be significantly increased by the compression treatment. Further when the areas of the metallic silver portion and the light-transmitting portion in the thin-wire structure portion 14 are appropriately designed, the resultant transparent conductive film 10 can be high in both the conductivity and light transmittance.

The compression treatment is preferably carried out before the process of dipping the support 12 having the thin-wire structure portion 14 in a hot water or bringing it into contact with a water vapor.

The compression treatment may be carried out using a calender roll unit. The calender roll unit generally has a pair of rolls. The compression treatment using the calender roll unit is hereinafter referred to as the calender treatment.

The roll used in the calender treatment may be composed of a metal or a plastic such as an epoxy, a polyimide, a polyamide, or a polyimide-amide. Particularly in a case where the photosensitive material has the emulsion layer on both sides, it is preferably treated by using a pair of the metal rolls. In a case where the photosensitive material has the emulsion layer only on one side, it may be treated by using the metal roll and the plastic roll in combination in view of preventing wrinkling. The lower limit of the line pressure is preferably 1960 N/cm (200 kgf/cm), more preferably 2940 N/cm (300 kgf/cm). The upper limit of the line pressure is preferably 6860 N/cm (700 kgf/cm). The line pressure means a force per 1 cm applied to a film sample to carry out the compression treatment.

The temperature, at which the smoothing treatment is carried out using typically the calender roll unit, is preferably 10° C. (without temperature control) to 100° C. Though the preferred temperature range is different depending on the density and the shape of the mesh or wiring pattern of the metal, the type of the binder, etc., the temperature is more preferably 10° C. (without temperature control) to 50° C. in general.

As described above, the transparent conductive film 10 with high conductivity can be easily produced at low cost by the production method according to this embodiment. In the production method using the photosensitive material containing the silver salt (particularly the silver halide) for producing the transparent conductive film 10, the smoothing treatment is preferably carried out at a high line pressure of 1960 N/cm (200 kgf/cm) or more, whereby the surface resistance of the transparent conductive film 10 can be sufficiently lowered. When the smoothing treatment is carried out at such a high line pressure, the line width of the metallic silver portion is increased, and it is often difficult to form the metallic silver portion in a desired thin wiring pattern (particularly a pattern with a line width of 25 μm or less). However, in the case of using the photosensitive material containing the silver salt (particularly the silver halide) as a subject of the smoothing treatment, the increase of the line width is reduced, and the metallic silver portion can be formed in a desired pattern. Thus, the metallic silver portion can be formed in a desired pattern with a uniform shape, whereby the productivity of the transparent conductive film 10 can be further improved while preventing defective products. When the smoothing treatment is carried out at the above line pressure, the smoothing treatment is preferably performed with the calender roll unit having the pair of metal rolls or the combination of the metal roll and the resin roll. The surface pressure between the rolls is preferably 600 kgf/cm² or more, more preferably 800 kgf/cm² or more, further preferably 900 kgf/cm² or more. In terms of the upper limit, the surface pressure is preferably 2000 kgf/cm² or less.

[Plating Treatment]

In this embodiment, the metallic silver portion may be subjected to the smoothing treatment, and may be subjected to a plating treatment. By the plating treatment, the surface resistance can be further reduced, and the conductivity can be further increased. The smoothing treatment may be carried out before or after the plating treatment. When the smoothing treatment is carried out before the plating treatment, the plating treatment can be more efficiently carried out to form a uniform plated layer. The plating treatment may be an electrolytic plating treatment or an electroless plating treatment. The material for the plated layer is preferably a metal with a sufficient conductivity such as copper.

The present invention may be combined without departing from the scope of the invention with technologies disclosed in the following patent publications: Japanese Laid-Open Patent Publication Nos. 2004-221564, 2004-221565, 2006-012935, 2006-010795, 2006-228469, 2006-228473, 2006-228478, 2006-228480, 2006-228836, 2006-267627, 2006-269795, 2006-267635, 2006-286410, 2006-283133, and 2006-283137.

(Treatment of Dipping in Hot Water or Bringing into Contact with Water Vapor)

In the production method according to this embodiment, after the thin-wire structure portion 14 is formed on the support 12, the resultant may be dipped in a hot water having a temperature of 40° C. or higher, or brought into contact with a water vapor. By this treatment, the conductivity and the transparency can be easily improved in a short time. As described above, the reason for the conductivity increase of the transparent conductive film 10 is unclear. In this embodiment, it is considered that the water-soluble binder is removed at least partly, whereby bindings between atoms of the metal (the conductive material) are increased.

The temperature of the hot water, in which the support 12 is dipped, is preferably 40° C. to 100° C., more preferably 60° C. to 100° C. The temperature is particularly preferably about 80° C. to 100° C., and the conductivity is significantly increased at such a temperature. The temperature of the water vapor, with which the support 12 is brought into contact, is preferably 100° C. to 140° C. at 1 atm. The pH of the hot water is preferably 2 to 13, more preferably 2 to 9, further preferably 2 to 5. The time of the treatment of dipping in the hot water having a temperature of 40° C. or higher or bringing into contact with the water vapor depends on the type of the water-soluble binder used. When the support 12 has a size of 60 cm×1 m, the time is preferably about 10 seconds to 5 minutes, more preferably about 1 to 5 minutes.

In the production method according to the embodiment, the mesh-shaped metallic silver portion having particular line width, opening ratio, and Ag content is formed directly on the support 12 by the exposure and development treatments. Therefore, the metallic silver portion has a satisfactory surface resistance, and it is not necessary to subject the metallic silver portion to the physical development and/or the plating treatment to increase the conductivity. Thus, the transparent conductive film 10 can be produced with easy step by the method.

The transparent conductive film 10 produced by the method according to this embodiment has a low resistance and a high light transmittance, and thereby can be widely used in liquid crystal displays, plasma display panels, organic EL devices, inorganic EL devices, solar cells, touch panels, printed circuit boards, etc.

<Voltage and Frequency>

A dispersion-type electroluminescence device is generally driven by an alternate current, typically using an alternate current source at 100 V and 50 to 400 Hz. In a small-area device, the luminance is increased approximately in proportion to the applied voltage and frequency. However, a device having a large area of 0.25 m² or more contains a larger amount of capacitance components, whereby the impedance matching between the device and the power source is often deteriorated, and the time constant for charge storage in the device is often increased. As a result, a sufficient electrical power cannot be supplied to the device even at a high voltage, particularly at a high frequency, in most cases. Particularly in the case of driving the device having a large area of 0.25 m² or more by an alternate current at 500 Hz or more, the applied voltage is often reduced as the drive frequency increases, tending to lower the luminance.

In contrast, an electroluminescence device containing the first electrode region 22 of this embodiment can be driven at high frequency to exhibit a high luminance even when the device has a large area of 0.25 m² or more. In this case, the electroluminescence device is driven preferably at 500 Hz to 5 KHz, more preferably at 800 Hz to 3 KHz.

The present invention will be described more specifically below with reference to Examples. Materials, amounts, ratios, treatment contents, treatment procedures, and the like, used in Examples, may be appropriately changed without departing from the scope of the invention. The following specific examples are, therefore, to be considered in all respects as illustrative and not restrictive.

FIRST EXAMPLE

First Example is described below. The properties (surface resistance, film strength, etc.) of the thin-wire structure portion 14 formed on the support 12 were evaluated in First Example.

EXAMPLES 1 to 14 and COMPARATIVE EXAMPLES 1 to 7

(Preparation of Emulsion A)

| Liquid 1 | |
|---|---|
| Water | 750 ml |
| Gelatin (phthalated gelatin) | 20 g |
| Sodium chloride | 3 g |
| 1,3-Dimethylimidazolidine-2-thione | 20 mg |
| Sodium benzenethiosulfonate | 10 mg |
| Citric acid | 0.7 g |
| Liquid 2 | |
| Water | 300 ml |
| Silver nitrate | 150 g |
| Liquid 3 | |
| Water | 300 ml |
| Sodium chloride | 38 g |
| Potassium bromide | 32 g |
| Potassium hexachloroiridate (III) (0.005% KCl, 20% aqueous solution) | 5 ml |
| Ammonium hexachlororhodate (0.001% NaCl, 20% aqueous solution) | 7 ml |

The potassium hexachloroiridate (III) (0.005% KCl, 20% aqueous solution) and the ammonium hexachlororhodate (0.001% NaCl, 20% aqueous solution) in Liquid 3 were prepared by dissolving a complex powder in a 20% aqueous solution of KCl and a 20% aqueous solution of NaCl, respectively, and by heating the resultant solutions at 40° C. for 120 minutes respectively.

Liquid 1 was maintained at 38° C. and pH 4.5, and Liquids 2 and 3 were simultaneously added in an amount of 90% of the total to Liquid 1 over 20 minutes under stirring, to form 0.16-μm nuclear particles. Then, Liquids 4 and 5 described below were added thereto over 8 minutes, and residual 10% of Liquids 2 and 3 were added over 2 minutes, so that the nuclear particles were grown to 0.21 μm. Further, 0.15 g of potassium iodide was added, and the resulting mixture was ripened for 5 minutes, whereby the particle formation was completed.

| Liquid 4 | |
|---|---|
| Water | 100 ml |
| Silver nitrate | 50 g |
| Liquid 5 | |
| Water | 100 ml |
| Sodium chloride | 13 g |
| Potassium bromide | 11 g |
| Yellow prussiate of potash | 5 mg |

The particles were water-washed by a common flocculation method. Specifically, the temperature was lowered to 35° C., and the pH was lowered by sulfuric acid until the silver halide was deposited (within a pH range of 3.6±0.2).

About 3 L of the supernatant solution was removed (first water washing). Further 3 L of a distilled water was added thereto, and sulfuric acid was added until the silver halide was deposited. About 3 L of the supernatant solution was removed again (second water washing). The procedure of the second water washing was repeated once more (third water washing), whereby the water washing and demineralization process was completed.

After the water washing and demineralization process, the obtained emulsion was controlled at a pH of 6.4 and a pAg of 7.5. 10 mg of sodium benzenethiosulfonate, 3 mg of sodium benzenethiosulfinate, 15 mg of sodium thiosulfate, and 10 mg of chlorauric acid were added thereto, whereby the emulsion was chemically sensitized at 55° C. to obtain the optimum sensitivity. Further 100 mg of a stabilizer of 1,3,3a,7-tetraazaindene and 100 mg of an antiseptic agent of PROXEL (trade name, available from ICI Co., Ltd.) were added thereto to obtain a final emulsion of cubic silver iodochlorobromide particles, which contained 70 mol % of silver chloride and 0.08 mol % of silver iodide, and had an average particle diameter of 0.22 μm and a variation coefficient of 9%. The final emulsion had a pH of 6.4, a pAg of 7.5, a conductivity of 40 μS/m, a density of $1.2 \times 10^3$ kg/m$^3$, and a viscosity of 60 mPa·s.

(Preparation of Emulsion B)

Emulsion B was prepared in the same manner as the preparation of Emulsion A except that the gelatin amount of the Liquid 1 was 8 g.

(Production of Coating Sample)

$5.7 \times 10^{-4}$ mol/mol Ag of a sensitizing dye sd-1 was added to each of Emulsions A and B to carry out spectral sensitization. Further, $3.4 \times 10^{-4}$ mol/mol Ag of KBr and $8.0 \times 10^{-4}$ mol/mol Ag of a compound Cpd-3 were added thereto, and the resultant mixture was well mixed.

Then, to the mixture were added $1.2 \times 10^{-4}$ mol/mol Ag of 1,3,3a,7-tetraazaindene, $1.2 \times 10^{-2}$ mol/mol Ag of hydroquinone, $3.0 \times 10^{-4}$ mol/mol Ag of citric acid, 90 mg/m$^2$ of a sodium salt of 2,4-dichloro-6-hydroxy-1,3,5-triazine, 15 wt % (based on the gelatin) of a colloidal silica having a particle diameter of 10 μm, 50 mg/m$^2$ of an aqueous latex aqL-6, 100 mg/m$^2$ of a polyethyl acrylate latex, 1mg/m$^2$ of a latex copolymer of methyl acrylate, sodium 2-acrylamide-2-methylpropanesulfonate, and 2-acetoxyethyl methacrylate (weight ratio 88:5:7), 100 mg/m$^2$ of a core-shell latex (core/shell ratio 50/50) having a core of a styrene/butadiene copolymer (weight ratio 37/63) and a shell of styrene/2-acetoxyethyl acrylate (weight ratio 84/16), and 4 wt % (based on the gelatin) of a compound Cpd-7. The pH of the obtained coating liquid was controlled at 5.6 by citric acid.

The emulsion layer coating liquid, prepared in the above manner using Emulsion A, was applied to a polyethylene terephthalate (PET) such that the Ag amount was 10.5 g/m$^2$ and the gelatin amount was 0.94 g/m$^2$, and then dried to obtain Coating sample A.

The emulsion layer coating liquid, prepared in the above manner using Emulsion B, was applied to a polyethylene terephthalate (PET) such that the Ag amount was 10.5 g/m$^2$ and the gelatin amount was 0.33 g/m$^2$, and then dried to obtain Coating sample B.

The surface of the PET was hydrophilized beforehand.

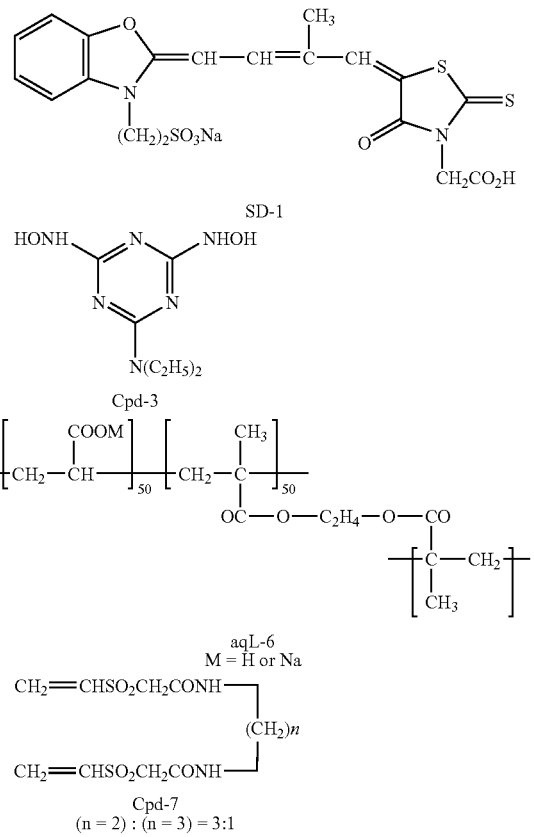

In Coating sample A, the emulsion layer had an Ag/binder volume ratio (silver/GEL ratio (vol)) of 1/0.7. Thus, the emulsion layer satisfies the Ag/binder ratio condition of 1/1 or more, which is preferably used in the photosensitive material for forming a conductive layer according to the present invention (see Examples 1 and 2, and Comparative Examples 1 and 2).

In Coating sample B, the emulsion layer had an Ag/binder volume ratio (silver/GEL ratio (vol)) of 4/1. Thus, the emulsion layer satisfies the Ag/binder ratio condition of 2/1 or more, which is more preferably used in the photosensitive material for forming a conductive layer according to the present invention (see Examples 3 and 4, and Comparative Example 3).

Samples of Examples 5 to 11 were produced in the same manner except for changing the gelatin amount.

(Exposure and Development)

Then, the dried coating layer was exposed to a parallel light from a light source of a high-pressure mercury lamp, through a photomask having a lattice-patterned space (line/space=195 μm/5 μm (pitch 200 μm)). The photomask was capable of forming a lattice-patterned developed silver image (line/space=5 μm/195 μm). The coating layer was developed using the following developer, further developed using a fixer N3X-R for CN16X (trade name, available from FUJIFILM Corporation), and rinsed with pure water, to obtain Samples a and b different in line width and opening ratio.

Samples A-a (see Comparative Example 1 and Example 1) and A-b (see Comparative Example 2 and Example 2) were produced using Coating sample A, and B-a (see Comparative Example 3 and Examples 3 and 4) and B-b (see Example 5) were produced using Coating sample B. Further entire surface-exposed samples were produced (see Comparative Example 7 and Examples 13 and 14).

[Composition of Developer]

1 L of the developer contained the following compounds.

| | |
|---|---|
| Hydroquinone | 0.037 mol/L |
| N-methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Calendar Treatment)

The above developed sample was subjected to a calender treatment. A calender roll had metal rollers (composed of an iron core and a plated hard chrome, roll diameter 250 mm), and the sample was moved between the rollers under a line pressure of 1960 N/cm (200 kgf/cm, corresponding to a surface pressure of 700 kgf/cm$^2$) to 7840 N/cm (800 kgf/cm, corresponding to a surface pressure of 1850 kgf/cm$^2$). The surface resistivity (Ω/sq) of the sample was measured before and after the treatment. In this example, a line pressure of 100 kgf/cm corresponds to a surface pressure of 417 kgf/cm$^2$, a line pressure of 200 kgf/cm corresponds to a surface pressure of 700 kgf/cm$^2$, a line pressure of 300 kgf/cm corresponds to a surface pressure of 936 kgf/cm$^2$, and a line pressure of 600 kgf/cm corresponds to a surface pressure of 1519 kgf/cm$^2$.

Sample A-a before the calender treatment is referred to as A-a-1 (Comparative Example 1), and Sample A-a after the treatment is referred to as A-a-2 (Example 1). Sample A-b before the calender treatment is referred to as A-b-1 (Comparative Example 2), and Sample A-b after the treatment is referred to as A-b-2 (Example 2).

Sample B before the calender treatment is referred to as B-a-1 (Comparative Example 3), and Sample B after the treatment is referred to as B-a-2 (Example 3).

In Sample B-a-2 (Example 3), the metallic silver portion had an Ag/non-conductive polymer volume ratio of 3.1/1, a density of 8.5 g/cm$^3$, and a thickness of 1.2 μm. Thus, the metallic silver portion satisfies the Ag/non-conductive polymer volume ratio condition of 3/1 or more and the thickness condition of 0.5 to 5 μm, preferably used in the conductive layer according to the present invention.

(Blackening Treatment)

The transparent film having the mesh-shaped silver image was electroplated using a positive carbon electrode in a bath of a blackening plating solution having the following composition.

The plating solution used in the blackening plating treatment was as follows.

[Composition of Blackening Solution]

| | |
|---|---|
| Nickel sulfate hexahydrate salt | 120 g |
| Ammonium thiocyanate | 17 g |
| Zinc sulfate heptahydrate salt | 28 g |
| Sodium sulfate | 16 g |
| Total (containing pure water) | 1 L | pH 5.0 (controlled by sulfuric acid and sodium hydroxide)

[Plating Conditions]

Bath temperature: about 30° C.

Time: 20 seconds

Negative electrode current density: 0.1 to 0.2 A/dm$^2$ (a current of 0.03 A was applied to the entire negative electrode (35 mm×12 cm))

Sample B-a-2 (Example 3) was subjected to the above blackening treatment to obtain Sample B-a-3 (Example 4).

COMPARATIVE EXAMPLES 4 to 6

For comparison with a technology with highest conductivity and high light transmittance among the conventional ones, a metal mesh described in Japanese Laid-Open Patent Publication No. 10-41682 was produced to obtain a sample of Comparative Example 4. The metal mesh is a typical example of etching-processed copper meshes produced using photolithography described above in "Background Art".

This sample (Comparative Example 4) was produced in the same manner as Examples in Japanese Laid-Open Patent Publication No. 10-41682.

This sample was produced using the above photomask having a pitch of 200 μm to obtain the same mesh shape, line width, and pitch as those of the samples according to the present invention.

Further, metal meshes different in opening ratio described in Japanese Laid-Open Patent Publication No. 2000-13088 were produced to obtain samples of Comparative Examples 5 and 6. The metal meshes are typical examples of meshes produced by printing a silver paste, described above in "Background Art".

[Evaluation]

In each of thus obtained samples according to the present invention and the samples of Comparative Examples having a conductive metal portion and a light-transmitting portion, the line width of the conductive metal portion was measured to obtain the opening ratio, and the surface resistivity (Ω/sq) was measured. An optical microscope, a scanning electron microscope, and a low resistivity meter were used in each measurement.

The color of the metal portion in the mesh was visually observed. The metal portion was evaluated as "Good" when the color was black, and evaluated as "Poor" when the color was brown or gray. Furthermore, the process number of the production method was evaluated. The sample was evaluated as "Good" when it was produced by 5 or less processes, and evaluated as "Poor" when it was produced by more than 5 processes.

The film strength was evaluated as follows.

The surface having the mesh metal portion was scratched by a 0.1-mm-φ sapphire stylus at a rate of 1 cm/sec while changing the load of the sapphire stylus from 0 to 100 g. The load, under which a scratch reached the base, was used as a scale of the film strength.

Excellent: The load, at which a scratch was formed, was 80 g or more.

Good: The load, at which a scratch was formed, was 50 g or more but less than 80 g.

Poor: The load, at which a scratch was formed, was 20 g or more but less than 50 g.

The evaluation results, as well as the data, of the samples are shown in Table 1.

TABLE 1

| | Sample | Calender pressure after development | Calender pressure after fixation | Blackening treatment | Silver/GEL ratio (vol) | Density g/cm³ | Thickness μm | Line width μm |
|---|---|---|---|---|---|---|---|---|
| Comparative Example 1 | A-a-1 | — | — | — | 1/0.7 | — | — | 15 |
| Example 1 | A-a-2 | — | 500 kgf/cm | — | 1/0.7 | — | — | 15 |
| Comparative Example 2 | A-b-1 | — | — | — | 1/0.7 | — | — | 9 |
| Example 2 | A-b-2 | — | 500 kgf/cm | — | 1/0.7 | — | — | 9 |
| Comparative Example 3 | B-a-1 | — | — | — | 4/1 | — | — | 15 |
| Example 3 | B-a-2 | — | 500 kgf/cm | — | 4/1 | 8.5 | 1.2 | 15 |
| Example 4 | B-a-3 | — | 500 kgf/cm | Performed | 4/1 | 8.5 | 1.2 | 15 |
| Comparative Example 4 | | — | JP10-41682A retest | — | — | — | — | 12 |
| Comparative Example 5 | | — | JP2000-13088A retest | — | — | — | — | 20 |
| Comparative Example 6 | | | | | | | | 20 |
| Example 5 | B-b-1 | — | 400 kgf/cm | — | 4/1 | — | — | 16.5 |
| Example 6 | | — | 400 kgf/cm | — | 3.06/1 | — | — | 16.5 |
| Example 7 | | — | 400 kgf/cm | — | 2.48/1 | — | — | 16.5 |
| Example 8 | | — | 400 kgf/cm | — | 2.08/1 | — | — | 16.5 |
| Example 9 | | — | 400 kgf/cm | — | 1.54/1 | — | — | 16.5 |
| Example 10 | | — | 400 kgf/cm | — | 1.28/1 | — | — | 16.5 |
| Example 11 | | — | 400 kgf/cm | — | 0.95/1 | — | — | 16.5 |
| Comparative Example 7 | | — | — | — | 4/1 | — | — | Entire surface |
| Example 13 | | — | 210 kgf/cm | — | 4/1 | — | — | Entire surface |
| Example 14 | | 210 kgf/cm | 210 kgf/cm | — | 4/1 | — | — | Entire surface |

| | Pitch μm | Opening ratio % | Surface resistance Ω/sq | Number of processes | Color | Film strength | Note |
|---|---|---|---|---|---|---|---|
| Comparative Example 1 | 200 | 86 | 2.5 | Good | Good | Poor | Comparative example |
| Example 1 | 200 | 86 | 1 | Good | Good | Excellent | Present invention |
| Comparative Example 2 | 200 | 91 | 3.5 | Good | Good | Poor | Comparative example |
| Example 2 | 200 | 91 | 1.5 | Good | Good | Excellent | Present invention |
| Comparative Example 3 | 200 | 86 | 2 | Good | Good | Poor | Comparative example |
| Example 3 | 200 | 86 | 0.5 | Good | Good | Good | Present invention |
| Example 4 | 200 | 86 | 0.5 | Good | Good | Excellent | Present invention |
| Comparative Example 4 | 200 | 88 | 0.1 | Poor | Poor | Excellent | Comparative example, etching |
| Comparative Example 5 | 200 | 81 (200-μ pitch) | 5 | Good | Good | Good | Comparative example, |
| Comparative Example 6 | 300 | 87 (300-μ pitch) | 9 | Good | Good | Good | silver paste, printing |
| Example 5 | 300 | 89 | 1.8 | Good | Good | Good | Present invention |
| Example 6 | 300 | 89 | 1.7 | Good | Good | Excellent | Present invention |
| Example 7 | 300 | 89 | 1.7 | Good | Good | Excellent | Present invention |
| Example 8 | 300 | 89 | 1.6 | Good | Good | Excellent | Present invention |
| Example 9 | 300 | 89 | 2.7 | Good | Good | Excellent | Present invention |

TABLE 1-continued

| | | | | | | | |
|---|---|---|---|---|---|---|---|
| Example 10 | 300 | 89 | 2.8 | Good | Good | Excellent | Present invention |
| Example 11 | 300 | 89 | 6.0 | Good | Good | Excellent | Present invention |
| Comparative Example 7 | — | — | 0.29 | Good | Good | Poor | Comparative example |
| Example 13 | — | — | 0.14 | Good | Good | Good | Present invention |
| Example 14 | — | — | 0.08 | Good | Good | Good | Present invention |

As shown in Table 1, the etching-processed copper mesh of Comparative Example 4 had a brown mesh color and was produced by a large number of processes. The silver paste-printed mesh of Comparative Example 5 had a large line width and therefore a low opening ratio. In Comparative Example 6, though the opening ratio was increased by widening the pitch, a new problem of high surface resistivity was caused.

In contrast, each sample of Examples 1 and 2 did not have the above problems of Comparative Examples, and exhibited a small line width, a small increase from the original line width, a high opening ratio, a low surface resistivity, and a high electromagnetic shielding ability.

The more preferred sample of Example 4 had the mesh metal portion with a black color, and thereby does not have an adverse effect (of contrast reduction) on an image of a display. The sample was produced by a small number of processes.

Furthermore, each sample of Examples 1 to 4 had a high film strength, whereby the mesh portion is hardly cracked or peeled in handling and has a highly reliable quality.

The samples of Examples 5 to 8, produced by changing the gelatin amount, had line widths slightly larger than those of Examples 1 to 4. However, the samples exhibited low surface resistivity even when the pitch was widened to increase the opening ratio. Thus, each sample of Examples 5 to 8 could have a higher opening ratio as compared with Examples 1 to 4. Further, the samples were excellent in film strength with high reliability.

The sample of Comparative Example 7, produced by entire surface exposure, was poor in film strength and had a problem of reliability, though it had a low surface resistivity. The samples of Examples 13 and 14, produced by entire surface exposure, had surface resistivities lower than that of Comparative Example 7. Further, the samples of Examples 13 and 14 were excellent in film strength and had sufficient reliability.

Each of the samples of Examples 9 to 11 had a high surface resistivity of more than 2.5 ($\Omega$/sq), and was insufficient in conductivity. However, the samples were excellent in film strength and had sufficient reliability.

SECOND EXAMPLE

Among the samples of Examples 1 to 14 shown in Table 1, the sample of Example 14, which was produced by carrying out the calender treatment after the development and also after the fixation, had the lowest surface resistivity of 0.08 ($\Omega$/sq).

Figure 10:
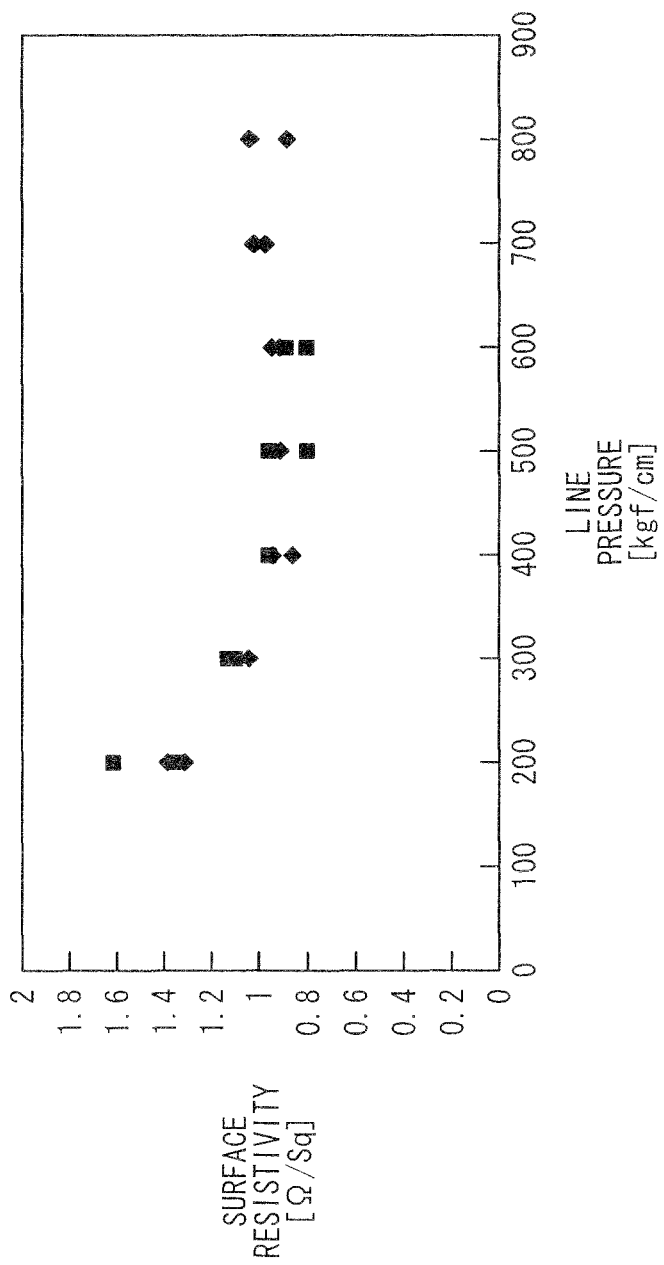
FIG. 10 is a characteristic diagram showing the relation between line pressure and surface resistivity in a calender treatment after development and a calender treatment after fixation.

Thus, the relation between line pressure and surface resistivity in the calender treatment after development and the calender treatment after fixation was examined. The results are shown in FIG. 10.

Sample B-a-2 (see Example 3) was used in this example. The sample was exposed and developed in the same manner as above, and then washed with pure water for 1 minute, and dried at 40° C. The dried sample was subjected to a calender treatment after development, and subjected to a fixation treatment using a fixer N3X-R for CN16X (trade name, available from FUJIFILM Corporation). Then, the sample was washed with pure water for 2 minutes, dried, and subjected to a calender treatment after fixation.

Two calender roll units were used in the calender treatments. A first calender roll unit contained a combination of a metal roll having an embossed surface and a metal roll having a mirror finished surface, and a second calender roll unit contained a combination of a metal roll having a mirror finished surface and a resin roll.

The surface resistivity change with the line pressure in the calender treatment (after development and after fixation) using the first calender roll unit is shown by diamond plot. The surface resistivity change with the line pressure in the calender treatment (after development and after fixation) using the second calender roll unit is shown by quadrangular plot.

It is clear from FIG. 10 that, in the case of carrying out the calender treatment after the development and also after the fixation, a surface resistivity of 1.8 ($\Omega$/sq) or less can be achieved by controlling the line pressure at 200 (kgf/cm) or more, almost regardless of the type of the calender roll unit. When the line pressure was increased to more than 700 (kgf/cm), the surface resistivity was slightly increased. Thus, the upper limit of the line pressure is preferably 700 (kgf/cm).

THIRD EXAMPLE

Third Example is described below. The properties (transmittance, volume resistance, surface resistance, flexibility, etc.) of the transparent conductive film 10 were evaluated in Third Example.

1. Production of Support 12 Having Thin-wire Structure Portion 14

(Preparation of Emulsion)

An emulsion used in Third Example is the same as Emulsion A of First Example, and duplicate explanations therefor are omitted.

(Production of Coating Sample)

A coating sample used in Third Example is the same as Coating sample A using Emulsion A described in First Example, and duplicate explanations therefor are omitted.

In the obtained coating sample, the emulsion layer had an Ag/binder volume ratio of 1/0.7. Thus, the emulsion layer satisfies the Ag/binder ratio condition of 1/4 or more, which is preferably used in the present invention.

(Exposure and Development Treatments)

Then, the dried coating layer was exposed to a parallel light from a light source of a high-pressure mercury lamp, through a lattice-patterned photomask capable of forming a developed silver image (line/space=10 μm/300 μm). The coating layer was developed using the developer, further developed using a fixer N3X-R for CN16X (trade name, available from FUJIFILM Corporation), and rinsed with pure water.

The photosensitive material, exposed and developed using the above treating agents, was subjected to a development treatment at 25° C. for 20 seconds, a fixation treatment at 25° C. for 20 seconds, and a water washing with a water stream (5 L/min) for 20 seconds. The photosensitive material was subjected to development treatment, water washing, drying, compression treatment, fixation treatment, water washing, drying, and compression treatment in this order. The compression treatment was carried out using a calender roll unit having metal rollers, and the sample was moved between the rollers under a line pressure of 3920 N/cm (400 kgf/cm).

2. Application of Conductive Layer 16

A transparent conductive layer 16 comprising the following conductive polymer was applied by a bar coater onto the above formed thin-wire structure portion 14 in a different application amount as shown in Table 2, to produce transparent conductive films of Examples 21 to 23 respectively. Further, a transparent conductive layer 16 was applied onto the PET base not having the thin-wire structure portion 14 to a thickness equal to one of Examples 21 to 23, to produce transparent conductive films of Comparative Examples 21 to 23 respectively. The conductive polymer was BAYTRON PEDOT (polyethylenedioxythiophene) available from TA Chemical Co. The conductive layer 16 was air-dried at the room temperature.

A sample of Comparative Example 24 comprising only the thin-wire structure portion 14 and a sample of Comparative Example 25 comprising an ITO layer were produced in the same manner.

3. Production of Electroluminescence Device

The obtained transparent conductive films (Examples 21 to 23 and Comparative Examples 21 to 25) were each incorporated in an inorganic dispersion-type EL (electroluminescence) device in the following manner, and subjected to a light emission test.

A reflective insulating layer containing a pigment having an average particle size of 0.03 μm and a light-emitting layer containing 50- to 60-μm fluorescent particles were applied to a back electrode of an aluminum sheet, and dried by a blow-dryer at 110° C. for 1 hour.

Then, the transparent conductive film 10 was stacked on and thermally compression-bonded to the fluorescent light-emitting layer and to a dielectric layer of the back electrode, to produce an EL device. The EL device was thermally compression-bonded to two water-absorbing Nylon 6 sheets with two moistureproof films disposed therebetween. The EL device had a size of 3 cm×5 cm or an A4 size.

4. Evaluation (Surface Resistance/Transmittance of Sample)

The samples of Examples 21 to 23 and Comparative Examples 21 to 25 were each subjected to the measurement of surface resistance and transmittance of a light having a wavelength of 550 nm.

(Luminance of Sample)

The sample having a size of 3 cm×5 cm was driven under a peak voltage of 100 V and a frequency of 1 kHz, and the initial luminance was evaluated.

(Evaluation of Flexibility)

The surface resistance rise rate K of each sample (Examples 21 to 23 and Comparative Examples 21 to 25) was obtained in the above bending test. The surface resistance rise rate K was obtained by using the equation K=R2/R1, in which R1 is the surface resistance of the sample before the bending test, and R2 is the surface resistance of the sample after the bending test.

In the bending test, as shown in FIG. 11, a roller 32 having a diameter of 4 mm was rotatably attached to a base 30. Each sample 34 (Examples 21 to 23 and Comparative Examples 21 to 25) was hanged on the roller 32, and was bent 100 times by repeating a process of rotating the roller 32 while pulling one end 34a of the sample 34 at a tension of 28.6 (kg) per 1-m width and a process of rotating the roller 32 while pulling the other end 34b of the sample 34 at a tension of 28.6 (kg) per 1-m width.

The samples was evaluated as "Good" when the surface resistance rise rate K was 1.2 or less, evaluated as "Fair" when the rate K was 1.2 to 10, and evaluated as "Poor" when the rate K was 10 or more.

(Result 1)

The results of evaluating the transmittance, the surface resistance of the thin-wire structure portion 14, the surface resistance of the conductive layer 16, the strength, and the flexibility of each sample (Examples 21 to 23 and Comparative Examples 21 to 25) are shown in Table 2.

TABLE 2

| | | | Volume resistance (Ω · cm) | | Surface resistance (Ω/sq) | | | |
| --- | --- | --- | --- | --- | --- | --- | --- | --- |
| | Transparent conductive film (contents) | Transmittance (%) | Thin-wire structure portion | Conductive layer | Thin-wire structure portion | Conductive layer | Luminance | Flexibility |
| Example 21 | Thin-wire structure portion + Conductive layer | 63 | $6 \times 10^{-6}$ | 5 | 1 | $3.8 \times 10^2$ | 16801 | Good |
| Example 22 | Thin-wire structure portion + Conductive layer | 66 | $6 \times 10^{-6}$ | 5 | 1 | $1.4 \times 10^4$ | 17610 | Good |
| Example 23 | Thin-wire structure portion + Conductive layer | 75 | $6 \times 10^{-6}$ | 5 | 1 | $1.6 \times 10^5$ | 24400 | Good |
| Comparative Example 21 | Conductive layer only | 79 | — | 5 | — | $3.8 \times 10^2$ | 29107 | Good |
| Comparative Example 22 | Conductive layer only | 81 | — | 5 | — | $1.4 \times 10^4$ | 19382 | Good |
| Comparative Example 23 | Conductive layer only | 90 | — | 5 | — | $1.6 \times 10^5$ | 0 | Good |
| Comparative Example 24 | Thin-wire structure portion Only | 90 | $6 \times 10^{-6}$ | — | 1 | — | 9049 | Good |
| Comparative Example 25 | ITO layer | 91 | — | $4 \times 10^{-4}$ | — | $3.8 \times 10^2$ | 32268 | Poor |

As shown in the evaluation results, the sample of Comparative Example 24 (the thin-wire structure portion only) had a surface resistance lower than that of Comparative Example 25 (the ITO layer only). However, as shown in FIG. 12A, in the sample of Comparative Example 24, light emission was obtained only around the thin wires, and the opening portions did not emit a light, resulting in a remarkably low luminance. In contrast, as shown in FIG. 12B, in the samples of Examples 21 to 23 having the conductive layer 16 with the thin-wire structure portion 14, light emission was observed over the entire surface. When the conductive layer 16 had a surface resistance of $10^5$ Ω/sq, light emission was observed over the entire surface in Example 23, while light emission was not observed in Comparative Example 23.

FOURTH EXAMPLE

Figure 13:
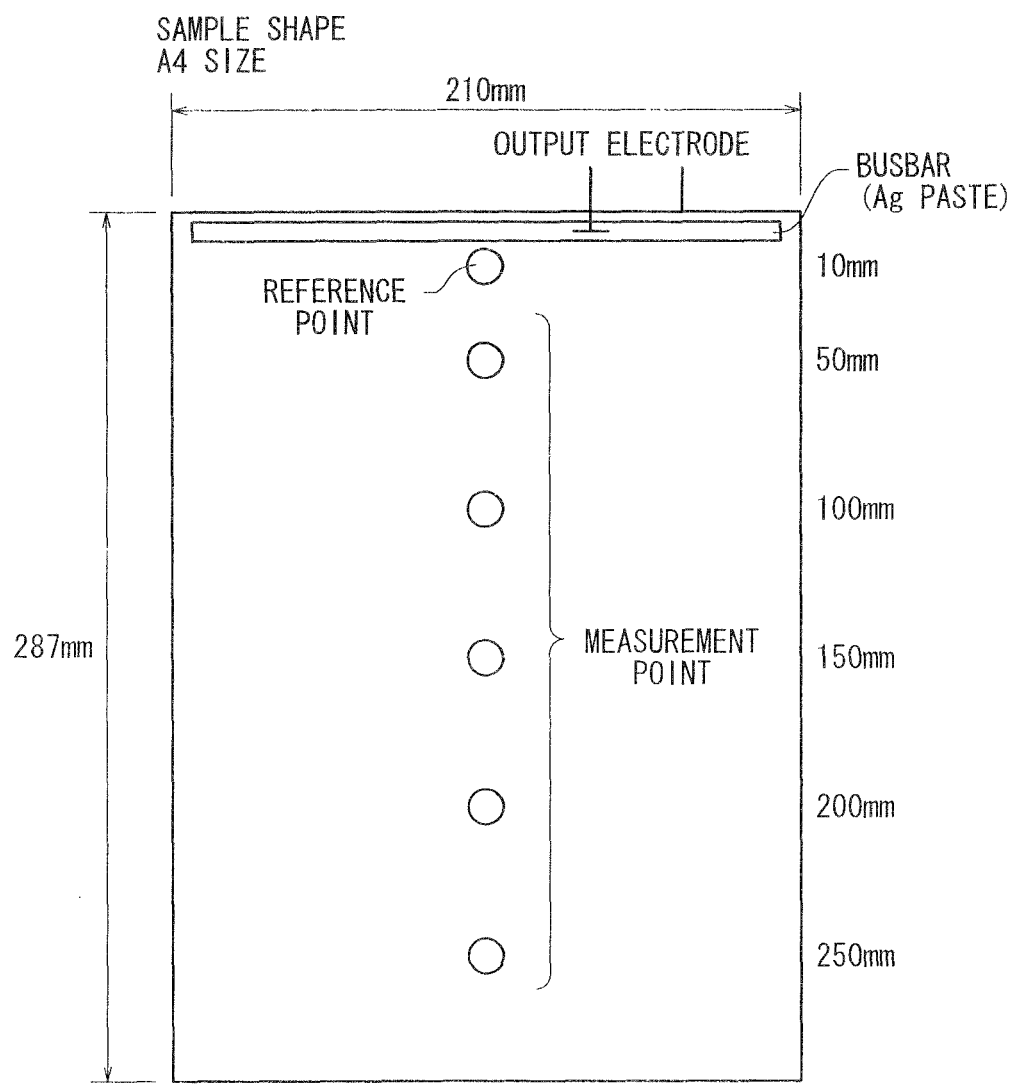
FIG. 13 is an explanatory view for an example experiment for measuring a luminance change with a distance from an output electrode.

Of the above produced samples, the A4-size samples (Example 23, and Comparative Examples 21, 24, and 25) were each driven under a peak voltage of 50 V and a frequency of 1.4 kHz, and as shown in FIG. 13 an output electrode was disposed on an Ag paste busbar. The luminance of each sample was measured while changing the distance from the output electrode. The luminance of a reference point in the vicinity of the output electrode was used as a standard (=1), and the luminance ratio was obtained at each measurement point. The reference point is at a shortest distance of 10 mm from the busbar, and the measurement points are at shortest distances of 50 mm, 100 mm, 150 mm, 200 mm, and 250 mm from the busbar respectively.

Figure 14:
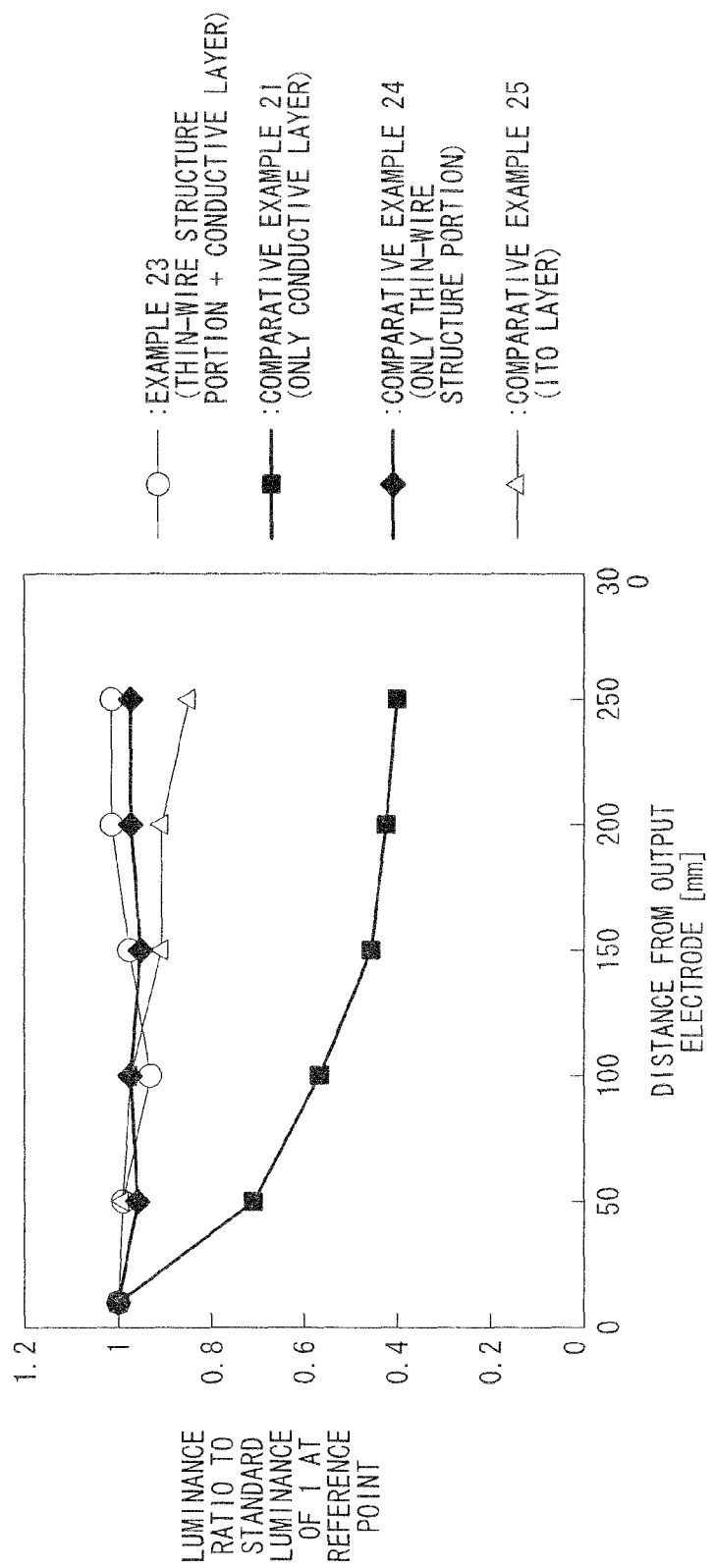
FIG. 14 is a characteristic diagram showing the results of measuring a luminance change with a distance from an output electrode in Example 23 and Comparative Examples 21, 24, and 25.

The measurement results are shown in FIG. 14. As is clear from the results, the luminance of Comparative Example 21 using only the conductive layer was lowered as the distance from the output electrode was increased. In Comparative Example 24 (only the thin-wire structure portion), though the luminance was approximately constant and was hardly lowered owing to the distance from the output electrode, there is the above described problem that surface emission cannot be achieved as shown in FIG. 12A. In Comparative Example 25 using the ITO layer, though the luminance was hardly lowered at the measurement points of 200 mm or less, the luminance was rapidly lowered at the measurement point of 250 mm. In contrast, in Example 23, the luminance was approximately constant and was hardly lowered owing to the distance from the output electrode, and additionally the light emission was achieved over the entire surface as shown in FIG. 12B.

FIFTH EXAMPLE

Samples 1 to 6 were subjected to the above bending test, and evaluated in terms of flexibility using the same standard (the surface resistance rise rate K) as above.

Sample 1 is an ITO film having a surface resistance of 300 Ω/sq, an ITO layer being formed thereon by sputtering.

Sample 2 is a transparent conductive film having the conductive layer 16 of PEDOT, and Sample 3 is a transparent conductive film having only the thin-wire structure portion 14 formed by exposing and developing the photosensitive material containing the support 12 and thereon the photosensitive silver salt layer.

Sample 4 is a transparent conductive film having the thin-wire structure portion 14 and the conductive layer 16, produced by the method including the calender treatment and the treatment of dipping in hot water. Sample 5 is a transparent conductive film having the conductive layer 16 over the entire upper surface of the support 12, produced by the method including the calender treatment and the treatment of dipping in hot water. Sample 6 is a transparent conductive film having the conductive layer 16 over the entire upper surface of the support 12, produced by the method including the calender treatment without the treatment of dipping in hot water.

Figure 15:
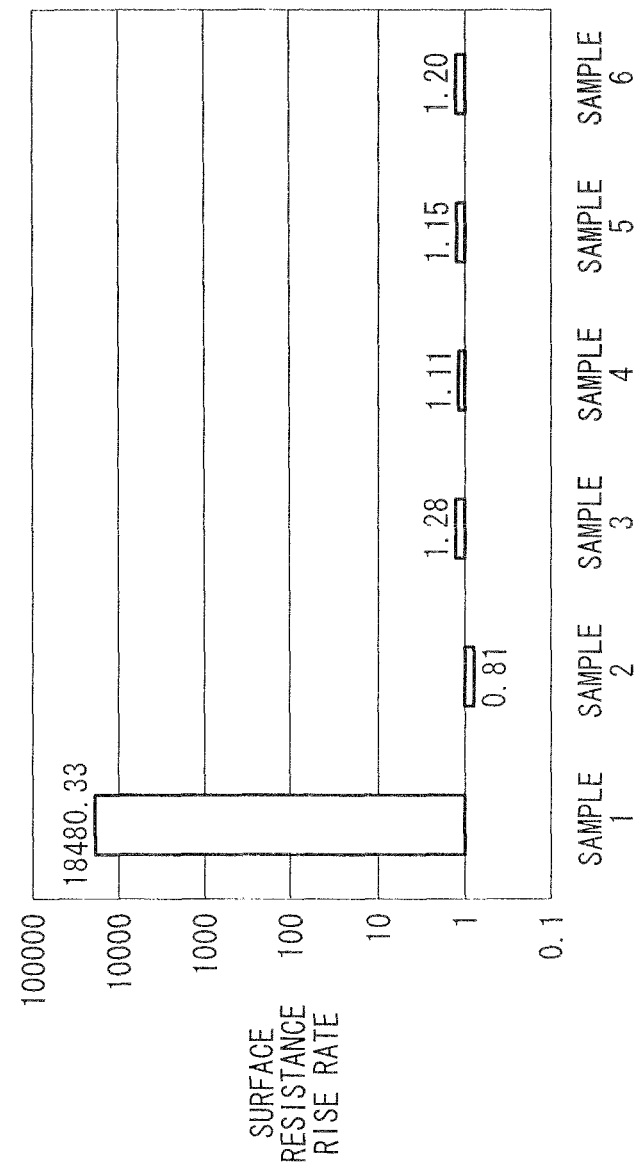
FIG. 15 is a diagram showing rates of surface resistance rise of Samples 1 to 6.

The evaluation results are shown in Table 3 and FIG. 15.

TABLE 3

| | Surface resistance (Ω/sq) before and after bending test | | | | | |
|---|---|---|---|---|---|---|
| | Sample 1 | Sample 2 | Sample 3 | Sample 4 | Sample 5 | Sample 6 |
| Before test | 216 | $3.88 \times 10^6$ | 0.211 | 0.645 | 0.0635 | 0.137 |
| After test | $3.99 \times 10^6$ | $3.15 \times 10^6$ | 0.271 | 0.713 | 0.0729 | 0.165 |

Sample 1 using the ITO layer exhibited an extremely high rise rate of 18480.33. In contrast, Samples 2 to 6 exhibited rise rates of 2 or less. The resistance of Sample 2 was not increased, and conversely lowered only slightly.

Thus, it is clear that transparent conductive films using the ITO layer such as Sample 1 are insufficient in flexibility.

It is to be understood that the self-luminous display device, the self-luminous display device producing method, the transparent conductive film, the electroluminescence device, the solar cell transparent electrode, and the electronic paper transparent electrode of the present invention are not limited to the above embodiment, and various changes and modifications may be made therein without departing from the scope of the invention.

The invention claimed is:

1. A self-luminous display device comprising a support, an electrode region, and a display region, wherein
   the electrode region is formed on the support and has a thin-wire structure portion containing a conductive metal and a light-transmitting conductive layer,
   the display region is disposed on the electrode region and has a light-emitting layer,
   in the electrode region, the thin-wire structure portion has a volume resistance of $10^{-4}$ Ω·cm or less and/or a surface resistance of 100 Ω/sq or less, and the conductive layer has a volume resistance of 0.05 Ω·cm or more and/or a surface resistance of 100 Ω/sq or more,
   when the electrode region has a surface resistance R1 before a bending test and has a surface resistance R2 after the bending test, the electrode region satisfies R2/R1<18, and
   in the bending test, a roller having a diameter of 4 mm is rotatably attached to a base, and the electrode region is hanged on the roller and is bent 100 times by repeating a process of rotating the roller while pulling one end of the electrode region at a tension of 28.6 (kg) per width of 1 m and a process of rotating the roller while pulling the other end of the electrode region at a tension of 28.6 (kg) per width of 1 m.

2. A self-luminous display device according to claim 1, wherein in the electrode region, the thin-wire structure portion has a volume resistance of $5 \times 10^{-5}$ Ω·cm or less and/or a surface resistance of 50 Ω/sq or less, and the conductive layer has a volume resistance of 0.5 Ω·cm or more and/or a surface resistance of 1000 Ω/sq or more.

3. A self-luminous display device according to claim 1, wherein the conductive layer in the electrode region contains a conductive material.

4. A self-luminous display device according to claim 3, wherein the conductive material contains a conductive transparent organic polymer or a conductive fine particle.

5. A self-luminous display device according to claim 1, wherein the electrode region has a light transmittance of 70% or more for a 550-nm light.

6. A self-luminous display device according to claim 1, wherein the thin-wire structure portion in the electrode region contains a conductive metallic silver generated by exposing and developing a photosensitive layer containing at least a photosensitive silver salt layer on the support.

7. A self-luminous display device according to claim 6, wherein the thin-wire structure portion in the electrode region contains a silver at an Ag/binder volume ratio of 1/4 or more.

8. A self-luminous display device according to claim 6, wherein the thin-wire structure portion in the electrode region is formed by exposing and developing a photosensitive material comprising the support and thereon the photosensitive silver salt layer, and by subjecting the generated conductive metallic silver to a compression treatment.

9. A transparent conductive film comprising a support, and a thin-wire structure portion containing a conductive metal and a light-transmitting conductive layer formed on the support, wherein the thin-wire structure portion has a volume resistance of $10^{-4}$ Ω·cm or less and/or a surface resistance of 100 Ω/sq or less, and the conductive layer has a volume resistance of 0.05 Ω·cm or more and/or a surface resistance of 100 Ω/sq or more, when the transparent conductive film has a surface resistance R1 before a bending test and has a surface resistance R2 after the bending test, the transparent conductive film satisfies R2/R1<18, and in the bending test, a roller having a diameter of 4 mm is rotatably attached to a base, and the transparent conductive film is hanged on the roller and is bent 100 times by repeating a process of rotating the roller while pulling one end of the transparent conductive film at a tension of 28.6 (kg) per width of 1 m and a process of rotating the roller while pulling the other end of the transparent conductive film at a tension of 28.6 (kg) per width of 1 m.

10. A transparent conductive film according to claim 9, wherein the thin-wire structure portion contains a silver at a density of 8.0 to 10.5 g/cm$^3$.

11. A transparent conductive film according to claim 9, wherein the thin-wire structure portion has a thickness of 0.5 to 10 μm.

12. A transparent conductive film according to claim 9, wherein the thin-wire structure portion has a wiring pattern with a line width of 0.1 to 25 μm.

* * * * *

UNITED STATES PATENT AND TRADEMARK OFFICE
CERTIFICATE OF CORRECTION

PATENT NO.        : 8,513,878 B2                          Page 1 of 1
APPLICATION NO. : 12/307482
DATED             : August 20, 2013
INVENTOR(S)       : Tokunaga et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 812 days.

Signed and Sealed this

Fifteenth Day of September, 2015

Michelle K. Lee
*Director of the United States Patent and Trademark Office*